US012805228B2

(12) United States Patent
Abel

(10) Patent No.: US 12,805,228 B2
(45) Date of Patent: Nov. 17, 2026

(54) METHODS FOR CONDITIONING A SURFACE PRIOR TO ETCHING TO OPTIMIZE ETCH PERFORMANCE

(71) Applicant: Tokyo Electron Limited, Tokyo (JP)

(72) Inventor: Kate Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 234 days.

(21) Appl. No.: 18/914,968

(22) Filed: Oct. 14, 2024

(65) Prior Publication Data

US 2026/0107718 A1 Apr. 16, 2026

(51) Int. Cl.
*H10P 95/90* (2026.01)
*H10P 50/66* (2026.01)
*H10P 70/00* (2026.01)
*H10P 95/70* (2026.01)

(52) U.S. Cl.
CPC ............ *H10P 50/667* (2026.01); *H10P 95/90* (2026.01)

(58) Field of Classification Search
CPC ............................... H10P 50/667; H10P 95/90
See application file for complete search history.

(56) References Cited

U.S. PATENT DOCUMENTS 5,374,328 A 12/1994 Remba et al.
6,616,014 B1 9/2003 Pozniak et al.
6,841,031 B2 1/2005 Iwata et al.
6,896,600 B1 5/2005 Wu et al.
7,683,021 B2 3/2010 Shea et al.
8,597,769 B2 12/2013 Takaya et al.
10,157,756 B2 12/2018 Yamada
10,982,335 B2 4/2021 Abel
11,802,342 B2 10/2023 Abel
2002/0004303 A1 1/2002 Agnello
2003/0087528 A1 5/2003 Kruwinus
2006/0289389 A1 12/2006 Shea
2009/0007938 A1 1/2009 Dubreuil et al.
2009/0047790 A1 2/2009 Raghu et al.
2010/0279435 A1 11/2010 Xu et al.

(Continued)

FOREIGN PATENT DOCUMENTS

KR 1020170022922 3/2017
KR 1020170077839 7/2017

(Continued)

OTHER PUBLICATIONS

International Search Report issued in Application No. PCT/US2019/061683, Mar. 13, 2020, 9 pgs.

(Continued)

*Primary Examiner* — Erin F Bergner
*Assistant Examiner* — Jonathan L Carter
(74) *Attorney, Agent, or Firm* — Egan, Enders & Huston LLP.

(57) ABSTRACT

New methods are provided for conditioning a surface of a material to be etched prior to etching the material. More specifically, the present disclosure provides various embodiments of methods for conditioning a surface of a metal layer prior to etching the metal layer using etch chemistry optimized for the bulk metal layer. In some embodiments, the techniques disclosed herein may be used to condition a surface of a ruthenium (Ru) layer prior to etching the ruthenium layer using halogenating etch chemistries in a wet atomic layer etching (ALE) process.

25 Claims, 9 Drawing Sheets

(56) References Cited

U.S. PATENT DOCUMENTS

| | | | |
|---|---|---|---|
| 2011/0094888 A1 | 4/2011 | Chen et al. | |
| 2012/0031768 A1 | 2/2012 | Reid et al. | |
| 2014/0154406 A1* | 6/2014 | Dordi | H10P 70/27 134/29 |
| 2014/0199840 A1 | 7/2014 | Bajaj et al. | |
| 2014/0370643 A1 | 12/2014 | Stern et al. | |
| 2016/0089686 A1 | 3/2016 | Lee et al. | |
| 2016/0118468 A1 | 4/2016 | Patil et al. | |
| 2016/0141210 A1 | 5/2016 | Lei et al. | |
| 2016/0372320 A1 | 12/2016 | Emoto | |
| 2017/0194196 A1 | 7/2017 | Brink et al. | |
| 2017/0356084 A1 | 12/2017 | Nakanishi et al. | |
| 2018/0040486 A1 | 2/2018 | Anthis et al. | |
| 2018/0090352 A1 | 3/2018 | Sotoku et al. | |
| 2018/0226278 A1 | 8/2018 | Arnepalli et al. | |
| 2018/0374936 A1 | 12/2018 | Kelly et al. | |
| 2019/0011734 A1 | 1/2019 | Otsuji | |
| 2019/0027383 A1 | 1/2019 | Nakal et al. | |
| 2019/0112716 A1 | 4/2019 | Winter | |
| 2019/0148192 A1 | 5/2019 | Yamaguchi | |
| 2019/0295856 A1 | 9/2019 | Tahara et al. | |
| 2020/0161148 A1 | 5/2020 | Abel | |
| 2020/0377792 A1 | 12/2020 | Guske et al. | |
| 2023/0117790 A1 | 4/2023 | Abel | |
| 2023/0118554 A1* | 4/2023 | Abel | C23F 1/30 |
| 2023/0121246 A1 | 4/2023 | Abel | |

FOREIGN PATENT DOCUMENTS

| | | |
|---|---|---|
| WO | 2017099718 | 6/2017 |
| WO | 2017205658 | 11/2017 |
| WO | 2018004649 | 1/2018 |
| WO | 2023150520 | 8/2023 |

OTHER PUBLICATIONS

International Search Report Issued in Application No. PCT/US2019/061678, Mar. 13, 2020, 8 pgs.

International Search Report and The Written Opinion; PCT/US2022/077672, Jan. 27, 2023, 11 pgs.

"Notification of Transmittal of The International Search Report and The Written Opinion of The International Searching Authority, or The Declaration", International Application No. PCT/US2025/040290; International Filing Date Aug. 1, 2025; Date of Mailing Dec. 1, 2025, 9 pgs.

* cited by examiner

300

METHODS FOR CONDITIONING A SURFACE PRIOR TO ETCHING TO OPTIMIZE ETCH PERFORMANCE

This application is related to commonly-assigned U.S. Pat. No. 11,802,342, entitled "METHOD FOR WET ATOMIC LAYER ETCHING OF RUTHENIUM", filed Feb. 17, 2022; the disclosure of which is expressly incorporated herein, in its entirety, by reference.

BACKGROUND

This disclosure relates to semiconductor device manufacturing, and, in particular, to the removal and etching of polycrystalline materials, such as metals. During routine semiconductor fabrication, various metals formed on a substrate may be removed by patterned etching, chemical-mechanical polishing, as well as other techniques. A variety of techniques are known for etching layers on a substrate, including plasma-based or vapor phase etching (otherwise referred to as dry etching) and liquid based etching (otherwise referred to as wet etching). In dry etching, gas phase etchants react with a surface of a substrate to form species that are volatized to remove material from the substrate surface. Wet etching generally involves dispensing a chemical solution over the surface of a substrate or immersing the substrate in the chemical solution. The chemical solution often contains a solvent and chemical etchant(s) designed to react with materials on the substrate surface and/or promote dissolution of the reaction products within the solvent. The chemical etchant(s) react with the substrate surface to produce soluble species, which are dissolved in the solvent to remove material from the substrate. Etchant composition and temperature may be controlled to control the etch rate, specificity, and residual material on the surface of the substrate post-etch.

A wide variety of materials can be deposited onto a semiconductor substrate and subsequently etched to form various features and structures on and within the semiconductor substrate. For example, metals such as ruthenium (Ru), copper (Cu), cobalt (Co), tungsten (W), molybdenum (Mo), etc., can be deposited onto a semiconductor substrate using various deposition techniques including chemical vapor deposition (CVD), plasma enhanced CVD (PECVD), physical vapor deposition (PVD) and atomic layer deposition (ALD). The metal layers deposited onto the substrate surface can be subsequently etched using a wide variety of wet and dry etching techniques, such as plasma etching, discharge etching, chemical vapor etching (CVE) and atomic layer etching (ALE).

Atomic layer etching (ALE) is a process that removes thin layers of material sequentially through one or more self-limiting reactions. For example, ALE typically refers to techniques that etch with atomic precision, i.e., by removing material one or a few monolayers of material at a time. ALE processes generally rely on a chemical modification of the surface to be etched followed by a selective removal of the modified surface layer. Thus, ALE processes offer improved performance by decoupling the etch process into sequential steps of surface modification and removal of the modified surface. In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process often leads to smoothing of the surface during etching rather than the roughening commonly seen during other etch processes.

A wet ALE process typically begins with a surface modification step, which exposes a material to a first etch solution to create a self-limiting modified surface layer. The modified surface layer may be created through oxidation, reduction, ligand binding, or ligand exchange. Ideally, the modified surface layer is confined to the top monolayer of the material and acts as a passivation layer to prevent the modification reaction from progressing any further. After the modified surface layer is formed, the wet ALE process may expose the modified surface layer to a second etch solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

It is well known that material surfaces have unique chemistry compared to the bulk material. In some materials, undercoordinated surface atoms are extremely reactive and may quickly form an inert surface passivation layer upon reacting with the ambient environment. For metals, this surface passivation layer often takes the form of an oxide, a hydroxide, or a hydrate. Unfortunately, surface passivation layers can be challenging to deal with when etching. In some cases, an etch chemistry optimized for the bulk material may struggle to remove the surface passivation layer because it is chemically distinct from the bulk material. In such cases, the surface passivation layer may reduce the etch rate or even prevent etching of the bulk material.

Accordingly, new methods are needed for conditioning a surface of a material prior to etching the material in order to allow more uniform etching of the surface passivation layer using chemistry optimized for the bulk material.

SUMMARY

The present disclosure provides new methods for conditioning a surface of a material to be etched prior to etching the material. More specifically, the present disclosure provides various embodiments of methods for conditioning a surface of a metal layer prior to etching the metal layer using etch chemistry optimized for the bulk metal layer. In some embodiments, the techniques disclosed herein are used to condition a surface of a ruthenium (Ru) layer prior to etching the ruthenium layer using halogenating etch chemistries in a wet atomic layer etching (ALE) process.

According to one embodiment, a method is provided herein for conditioning a surface of a metal layer to be etched prior to etching the metal layer. The method may generally include: (a) receiving a substrate having the metal layer formed thereon, wherein a metal surface is exposed on a surface of the substrate, (b) annealing the substrate in a reducing atmosphere to at least partially reduce the metal surface, (c) exposing the substrate to a gas-phase L-type ligand to form a passivation layer on the metal surface, and (d) etching the metal layer using a wet etch process.

The metal layer formed on the substrate may generally be a transition metal. For example, the metal layer may be a ruthenium (Ru) layer, a cobalt (Co) layer, a copper (Cu) layer, a tungsten (W) layer, a molybdenum (Mo) layer, a tantalum (Ta) layer, a niobium (Nb) layer, a titanium (Ti) layer, a zirconium (Zr) layer or a hafnium (Hf) layer. In one embodiment, the metal layer formed on the substrate may be a ruthenium (Ru) layer that was previously deposited on the substrate using various deposition techniques (e.g., CVD, PVD, ALD, etc.).

A wide variety of gas-phase L-type ligands can be used to form a passivation layer on the post-anneal metal surface. For example, the gas-phase L-type ligand may be carbon monoxide (CO), cyclohexadiene ($C_6H_8$) or another alkene, ammonia ($NH_3$), an alkyl amine or a phosphine. The passivation layer formed on the post-anneal metal surface generally depends on the gas-phase L-type ligand used during the re-passivation step. In one example embodiment, said exposing the substrate to a gas-phase L-type ligand may comprise exposing the substrate to a carbon monoxide (CO) gas to form a carbonyl passivation layer on the metal surface.

In the method disclosed above, the passivation layer (e.g., a carbonyl passivation layer or another passivation layer) formed on the metal surface increases an etch rate of the metal layer during the wet etch process, compared to an etch rate achieved without the passivation layer. In some embodiments, the passivation layer formed on the metal surface may increase the etch rate of the metal layer by: (a) reversing oxidative passivation of the metal surface, which occurred before said receiving the substrate, and/or (b) preventing oxidative passivation of the metal surface during said etching the metal layer.

A wide variety of wet etch processes can be used in the method disclosed above to etch the metal layer formed on the substrate. In some embodiments, the metal layer may be etched by performing multiple cycles of a wet atomic layer etching (ALE) process, wherein each cycle comprises: (a) exposing the metal surface to a first etch solution comprising a halogenation agent dissolved in a non-aqueous solvent to form a metal halide or oxyhalide passivation layer, which is self-limiting and insoluble in the non-aqueous solvent; (b) rinsing the substrate with a first purge solution to remove the first etch solution from the surface of the substrate; (c) exposing the metal halide or oxyhalide passivation layer to a second etch solution to selectively remove the metal halide or oxyhalide passivation layer and expose an unmodified metal surface underlying the metal halide or oxyhalide passivation layer; and (d) rinsing the substrate with a second purge solution to remove the second etch solution from the surface of the substrate and etch the metal layer. Although etch chemistries are disclosed for etching ruthenium in a wet ALE process, one skilled in the art would recognize how the techniques disclosed herein could be used to condition a surface of other metal layers prior to etching such layers using potentially other wet etch chemistries and/or processes.

According to another embodiment, a method is provided herein for conditioning a surface of a ruthenium (Ru) layer to be etched prior to etching the ruthenium layer in a wet atomic layer etching (ALE) process. The method may generally include: (a) receiving a substrate having the ruthenium layer formed thereon, wherein a ruthenium surface is exposed on a surface of the substrate, (b) annealing the substrate in a reducing atmosphere to at least partially reduce the ruthenium surface, and (c) exposing the substrate to a gas-phase L-type ligand to form a carbonyl passivation layer on the ruthenium surface. After forming the carbonyl passivation layer on the ruthenium surface, the method may further include: (d) etching the ruthenium layer by performing multiple cycles of the wet ALE process, wherein each cycle comprises: (i) exposing the ruthenium surface to a first etch solution comprising a chlorinating agent dissolved in a non-aqueous solvent to form a ruthenium chloride or oxychloride passivation layer, which is self-limiting and insoluble in the non-aqueous solvent, (ii) rinsing the substrate with a first purge solution to remove the first etch solution from the surface of the substrate, (iii) exposing the ruthenium chloride or oxychloride passivation layer to a second etch solution to selectively remove the ruthenium chloride or oxychloride passivation layer and expose an unmodified ruthenium surface underlying the ruthenium chloride or oxychloride passivation layer, and (iv) rinsing the substrate with a second purge solution to remove the second etch solution from the surface of the substrate and etch the ruthenium layer.

In the method disclosed above, the carbonyl passivation layer formed on the ruthenium surface increases an etch rate of the ruthenium layer during said etching, compared to an etch rate achieved without the carbonyl passivation layer. In some embodiments, the carbonyl passivation layer formed on the ruthenium surface may optimize the wet ALE process by reversing oxidative passivation of the ruthenium surface and returning surface ruthenium atoms to the zero valent state. In some embodiments, the carbonyl passivation layer formed on the ruthenium surface may also prevent formation of ruthenium dioxide ($RuO_2$) and/or other ruthenium species having oxidation states higher than 3+ on the ruthenium surface during said etching the ruthenium layer.

In the methods disclosed above, a passivation layer (e.g., a carbonyl passivation layer or another passivation layer) is formed on a metal surface, such as a ruthenium surface, by: (a) annealing the substrate in a reducing atmosphere to at least partially reduce the metal surface, and (b) exposing the substrate to a gas-phase L-type ligand to form the passivation layer on the metal surface. The process conditions used during the anneal and re-passivation steps may generally depend on the metal layer (e.g., a Ru, Co, Cu, W, Mo, Ta, Nb, Ti, Zr or Hf layer) being etched.

In some embodiments, the substrate may be exposed to a gaseous reducing agent and a first temperature ranging between 100 °C. and 500 °C. during the anneal step. A wide variety of gaseous reducing agents can be used during the anneal step to at least partially reduce the metal surface. For example, the gaseous reducing agent used during the anneal step may comprise hydrogen ($H_2$), hydrazine ($N_2H_4$), carbon monoxide (CO), ammonia ($NH_3$), methane ($CH_4$), formic acid ($CH_2O_2$) or another volatile carboxylic acid. In one example embodiment, the metal layer may be a ruthenium (Ru) layer having a ruthenium surface exposed on the surface of the substrate. In such an embodiment, said annealing the substrate may comprise exposing the substrate to a hydrogen ($H_2$) gas and a temperature ranging between 150 °C. and 250 °C. to at least partially desorb any oxide, hydroxide or hydrate groups bound to the ruthenium surface.

In some embodiments, the substrate may be exposed to a gas-phase L-type ligand and a second temperature ranging between 25 °C. and 400 °C. during the re-passivation step. A wide variety of gas-phase L-type ligands can be used during the re-passivation step to form a carbonyl passivation layer on the metal surface. For example, the gas-phase L-type ligand may be carbon monoxide (CO), cyclohexadiene ($C_6H_8$) or another alkene, ammonia ($NH_3$), an alkyl amine or a phosphine. The second temperature used during the re-passivation step may be less than the first temperature used during the anneal step, and may generally depend on the thermal stability of the passivation layer (e.g., a carbonyl passivation layer or other passivation layer) formed during the re-passivation step. In one example embodiment, the metal layer may be a ruthenium (Ru) layer having a ruthenium surface exposed on the surface of the substrate. In such an embodiment, said exposing the substrate to the gas-phase L-type ligand may comprise exposing the substrate to carbon monoxide (CO) while the substrate is exposed to a temperature less than 75 °C. to form a carbonyl passivation layer on the ruthenium surface.

In some embodiments, said exposing the substrate to the gas-phase L-type ligand may be performed immediately after said annealing the substrate without exposing the substrate to air or other oxidizing environments.

In the example embodiments disclosed above, different gases (e.g., $H_2$ and CO) are used during the annealing and re-passivation steps to reduce and re-passivate a metal surface, such as a ruthenium surface. In other embodiments, the same gas (e.g., CO) may be used as a both a reducing agent and a carbonyl re-passivation agent. For example, said annealing the substrate may comprise exposing the substrate to CO gas and a first temperature ranging between 150 °C. and 250 °C. to at least partially desorb any oxide, hydroxide or hydrate groups bound to the ruthenium surface, and said exposing the substrate to the gas-phase L-type ligand may comprise continuing to expose the substrate to the CO gas while the substrate is exposed to a second temperature less than 75 °C. to form the carbonyl passivation layer on the metal surface.

As noted above and described further herein, the present disclosure provides various embodiments of methods for conditioning a surface of a material to be etched prior to etching the material. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
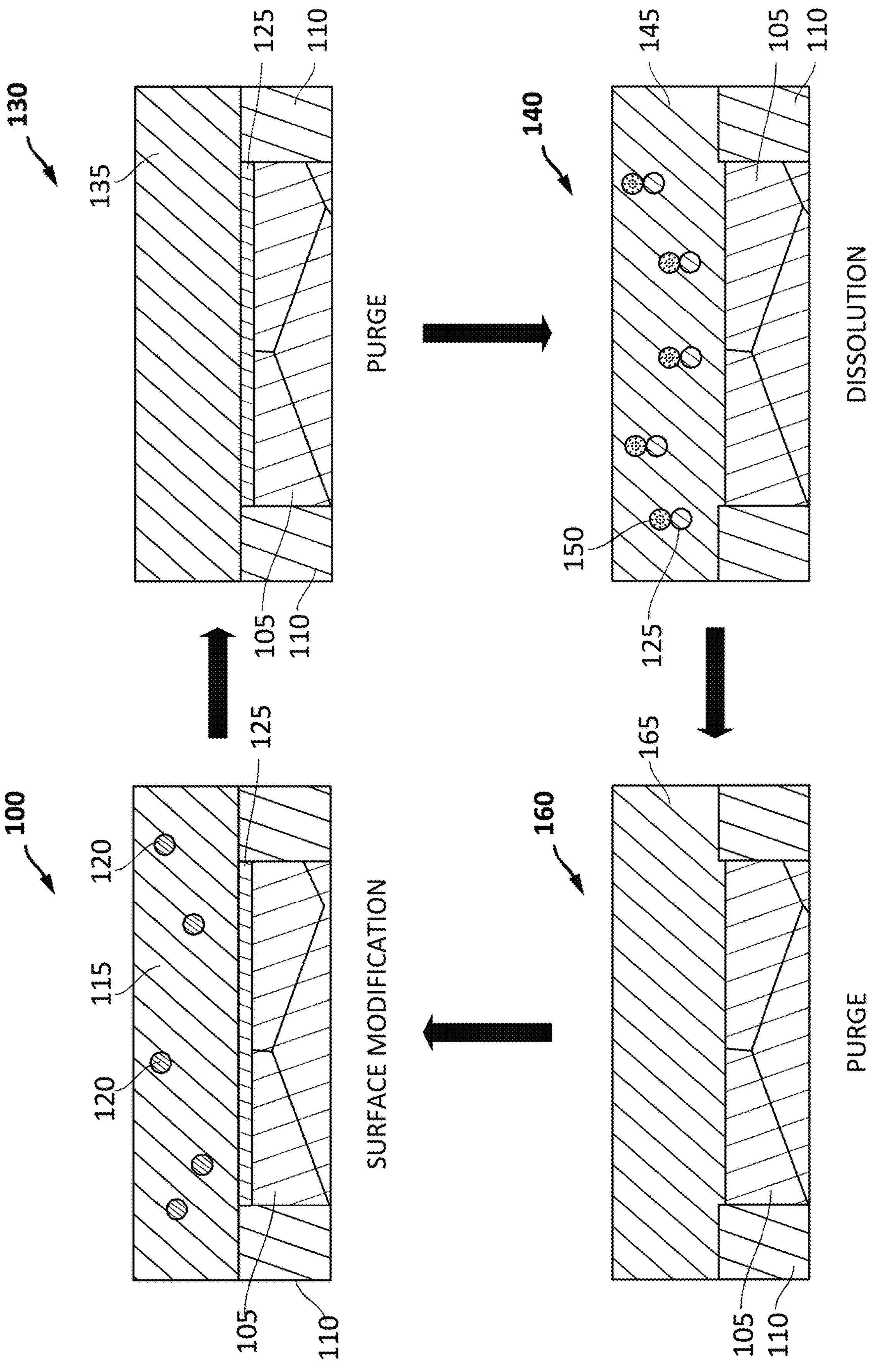
FIG. 1 illustrates one example of a wet atomic layer etching (ALE) process that can be used to etch a metal layer in accordance with the present disclosure.

The present disclosure provides new methods for conditioning a surface of a material to be etched prior to etching the material. More specifically, the present disclosure provides various embodiments of methods for conditioning a surface of a metal layer prior to etching the metal layer using etch chemistry optimized for the bulk metal layer. In some embodiments, the techniques disclosed herein are used to condition a surface of a ruthenium (Ru) layer prior to etching the ruthenium layer using halogenating etch chemistries in a wet atomic layer etching (ALE) process.

The techniques described herein may be generally used to etch ruthenium, which is a noble metal that is usually polycrystalline as deposited. Although many chemicals can be used to etch ruthenium, the polycrystalline nature of ruthenium makes it susceptible to pitting if an etchant preferentially attacks the grain boundaries. Etchant chemistry should, at a minimum, leave the surface no rougher than it was initially and ideally improve the surface roughness during etching. Acceptable surface morphology can be accomplished through the formation of a self-limiting passivation layer that is selectively removed in a cyclic wet ALE process.

Conventional methods for etching ruthenium often use oxidizing agents (or oxidizers) to form a ruthenium metal-oxide passivation layer on the ruthenium surface. For example, a chemical solution containing dissolved oxygen or another oxidizing agent can be used to oxidize a ruthenium surface and form a ruthenium dioxide ($RuO_2$) surface layer, which is insoluble in the chemical solution. Alternatively, strong oxidizers (such as sodium hypochlorite, ceric ammonium nitrate or periodic acid) can oxidize a ruthenium surface to create a soluble ruthenium tetroxide ($RuO_4$) surface layer on exposed surfaces of the ruthenium. Unfortunately, the oxidizers used in these methods either form: (a) an insoluble $RuO_2$ surface layer, which is difficult to deal with in the etch process, or (b) a soluble $RuO_4$ surface layer, which is extremely volatile and soluble, leading to insufficient surface passivation during the etch and post-etch surface roughness. The oxidizers typically used to form $RuO_4$ surface layers are also expensive and/or pose a metal contamination risk.

New etch chemistries for etching ruthenium (as well as other transition and noble metal surfaces) in a wet ALE process are disclosed in commonly assigned U.S. Pat. No. 11,802,342, entitled "METHOD FOR WET ATOMIC LAYER ETCHING OF RUTHENIUM", the disclosure of which is incorporated herein by reference. The etch chemistry disclosed in the '342 Patent differs from traditional ruthenium wet etch chemistries in that it primarily uses halogenation, rather than oxidation, to form an insoluble ruthenium species on the ruthenium surface. In the '342 Patent, the ruthenium surface is exposed to a halogenation agent during the surface modification step to form a ruthenium halide, a ruthenium oxyhalide or a ruthenium salt passivation layer on the ruthenium surface. The ruthenium halide, ruthenium oxyhalide or ruthenium salt passivation layer is insoluble in the surface modification solution, but freely soluble in the dissolution solution used to selectively remove the modified surface layer during each cycle of the wet ALE process.

FIG. 1 illustrates one example of a wet ALE process in accordance with the present disclosure and the techniques previously disclosed in the '342 Patent. More specifically, FIG. 1 illustrates exemplary steps performed during one cycle of a wet ALE process used to etch a polycrystalline material 105. In one embodiment, the polycrystalline material 105 to be etched may be ruthenium (Ru). However, the wet ALE process shown in FIG. 1 and the methods disclosed further herein are not limited to etching ruthenium, and may also be used to etch other transition and noble metals, such as but not limited to, cobalt (Co), copper (Cu), molybdenum (Mo), tungsten (W), gold (Au), platinum (Pt) and iridium (Ir).

In the process shown in FIG. 1, a polycrystalline material 105 surrounded by a dielectric material 110 is brought in contact with a surface modification solution 115 during a surface modification step 100 to modify exposed surfaces of the polycrystalline material 105. In some embodiments, the surface modification solution 115 may contain a halogenation agent 120 dissolved in a first solvent. For example, the surface modification solution 115 may include a first solvent containing a chlorinating agent, a fluorinating agent or a brominating agent. In other embodiments, the surface modification solution 115 may include an oxidizing agent and a chloride salt in concentrated hydrochloric acid (HCl).

When exposed to the surface modification solution 115, a chemical reaction occurs between the halogenation agent 120 and the exposed surface of the polycrystalline material 105 to form a modified surface layer 125 (e.g., a ruthenium halide, a ruthenium oxyhalide or a ruthenium salt modified surface layer) in the surface modification step 100. In some cases, the chemical reaction to form the modified surface layer 125 may be fast and self-limiting. In other words, the reaction product may modify one or more monolayers of the exposed surface of the polycrystalline material 105, but may prevent any further reaction between the surface modification solution 115 and the underlying surface. By necessity, neither the polycrystalline material 105 to be etched nor the modified surface layer 125 can be soluble in the surface modification solution 115. In some cases, the surface modification step 100 shown in FIG. 1 may continue until the surface reaction is driven to saturation.

After the modified surface layer 125 is formed, the substrate may be rinsed with a first purge solution 135 to remove excess reactants from the surface of the substrate in a first purge step 130. The first purge solution 135 should not react with the modified surface layer 125 or with the reagents present in the surface modification solution 115. In some embodiments, the first purge solution 135 used in the first purge step 130 may use the same solvent (e.g., the first solvent) previously used in the surface modification step 100. In other embodiments, a different solvent may be used in the first purge solution 135. In some embodiments, the first purge step 130 may be long enough to completely remove all excess reactants from the substrate surface.

Once rinsed, a dissolution step 140 is performed to selectively remove the modified surface layer 125. In the dissolution step 140, the modified surface layer 125 is exposed to a dissolution solution 145 to selectively remove or dissolve the modified surface layer 125 without removing the unmodified polycrystalline material 105 underlying the modified surface layer 125. The modified surface layer 125 must be soluble in the dissolution solution 145, while the unmodified polycrystalline material 105 underlying the modified surface layer 125 must be insoluble. The solubility of the modified surface layer 125 allows its removal through dissolution into the bulk dissolution solution 145. In some embodiments, the dissolution step 140 may continue until the modified surface layer 125 is completely dissolved.

A variety of different dissolution solutions 145 may be used in the dissolution step, depending on the surface modification solution 115 used during the surface modification step 100 and/or the modified surface layer 125 formed. In some embodiments, for example, the dissolution solution 145 may be an aqueous solution containing a ligand 150, which assists in the dissolution process. For example, the ligand 150 may react or bind with the modified surface layer 125 to form a soluble species that dissolves within the dissolution solution 145. In other embodiments, the dissolution solution 145 may be a second solvent, which is different from the first solvent used in the surface modification solution 115. In other embodiments, the dissolution solution 145 may contain alkali metal ions in a basic solution. In such embodiments, ion exchange may be used to improve the solubility of the modified surface layer 125 in aqueous solution.

Once the modified surface layer 125 is dissolved, the ALE etch cycle shown in FIG. 1 may be completed by performing a second purge step 160. The second purge step 160 may be performed by rinsing the surface of the substrate with a second purge solution 165, which may be the same or different than the first purge solution 135. In some embodiments, second purge solution 165 may use the same solvent, which was used in the dissolution solution 145. The second purge step 160 may generally continue until the dissolution solution 145 and/or the reactants contained with the dissolution solution 145 are completely removed from the surface of the substrate.

Wet ALE of ruthenium requires the formation of a self-limiting passivation layer on the ruthenium surface. The formation of this passivation layer is accomplished by exposure of the ruthenium surface to a first etch solution (i.e., surface modification solution 115) that enables or causes a chemical reaction between the species in solution and the ruthenium surface. This passivation layer must be insoluble in the solution used for its formation, but freely soluble in the second etch solution (i.e., dissolution solution 145) used for its dissolution.

A wide variety of etch chemistries may be used in the surface modification solution 115 and the dissolution solution 145 when etching noble metals, such as ruthenium (Ru), using the wet ALE process shown in FIG. 1. Example etch chemistries for etching ruthenium are discussed in more detail below. Mixing of these solutions leads to a continuous etch process, loss of control of the etch and roughening of the post-etch surface, all of which undermines the benefits of wet ALE. Thus, purge steps 130 and 160 are performed in the wet ALE process shown in FIG. 1 to prevent direct contact between the surface modification solution 115 and the dissolution solution 145 on the substrate surface.

According to one embodiment, a ruthenium surface may be exposed to a surface modification solution 115 containing a chlorinating agent dissolved in a first solvent. The chlorinating agent chemically modifies the ruthenium surface to form a ruthenium chloride or oxychloride passivation layer. In one example embodiment, a ruthenium trichloride ($RuCl_3$) passivation layer is formed when the ruthenium surface is exposed to a surface modification solution 115 containing trichloroisocyanuric acid (TCCA) dissolved in various organic solvents, such as ethyl acetate (EA), acetone, acetonitrile or a chlorocarbon. In this embodiment, TCCA acts as both the oxidizer and the chlorine source in the surface modification reaction. Although TCCA oxidizes the ruthenium surface in the chemical sense to form a ruthenium trichloride ($RuCl_3$) passivation layer on the ruthenium surface, no metal-oxide is being formed in the reaction. This differs from conventional ruthenium etch chemistries, which utilize oxidizing agents (or oxidizers) to form a ruthenium metal-oxide (e.g., a $RuO_2$ or $RuO_4$) passivation layer.

In the etch chemistry described above, the reactant used for the chlorination of the ruthenium surface is TCCA. However, other chlorinating agents such as, but not strictly limited to, oxalyl chloride, thionyl chloride and N-chlorosuccinimide, can also be used to oxidate and chlorinate the ruthenium surface. This is not an exhaustive list of all possible chlorinating agents that can be used in the surface modification step 100. Additionally, other ruthenium halides can also be formed on the ruthenium surface and used as a passivation layer. For example, ruthenium fluorides and ruthenium bromides can be used, in addition to ruthenium chlorides. These ruthenium halides can be formed using various fluorinating agents and brominating agents such as, e.g., 1-fluoro-2,4,6-trimethylpyridinium tetrafluoroborate, N-fluorobenzenesulfonimide, N-bromosuccinimide, or dibromoisocyanuric acid.

The self-limiting passivation layer formed during the surface modification step 100 must be removed every cycle after its formation. A second solution is used in the dissolution step 140 to selectively dissolve this modified layer. When TCCA dissolved in EA is used in the surface modification solution 115 to form a ruthenium chloride (e.g., $RuCl_3$) passivation layer on the ruthenium surface, reactive dissolution can be used in the dissolution step 140 to effectively remove the ruthenium chloride passivation layer. In reactive dissolution, ligands dissolved in a second solvent react with the surface to form a soluble species that dissolves within the dissolution solution 145. Many different ligand species can be used for reactive dissolution of the $RuCl_3$ passivation layer. In one embodiment, ethylenediaminetetraacetic acid (EDTA) may be used as the ligand species for reactive dissolution. EDTA reacts with $RuCl_3$ to form a Ru-EDTA complex that is soluble in aqueous solution. This reaction is base catalyzed, so the dissolution solution 145 must contain EDTA and a strong base. Mixing of the TCCA-containing surface modification solution 115 and the EDTA-containing dissolution solution 145 leads to a continuous etch process, loss of control of the etch, and roughening of the surface. Therefore, solvent rinse steps (i.e., purges steps 130 and 160) are necessary to prevent direct contact between the two etch solutions on the ruthenium surface.

In the etch chemistry described above, the dissolution solution 145 is an aqueous solution of EDTA as the ligand 150 and tetramethylammonium hydroxide (TMAH, $(CH_3)_4NOH$) as the base. Alternative ligands for dissolution include, but are not limited to, iminodiacetic acid (IDA), diethylenetriaminepentaacetic acid (DTPA) and acetylacetone (ACAC). EDTA, IDA, and DTPA can be used in aqueous solution, while ACAC can be used in aqueous solution, ethanol, dimethyl sulfoxide (DMSO) or other organic solvents. Any strong base can be used in the dissolution solution 145. For example, bases such as potassium hydroxide (KOH), sodium hydroxide (NaOH), ammonium hydroxide ($NH_4OH$), tetramethylammonium hydroxide (TMAH, $(CH_3)_4NOH$), or any other strong base can be used in the dissolution solution 145 as it is just needed to deprotonate the ligand 150 to allow binding with the ruthenium surface.

The wet ALE process described above relies on both the surface modification and dissolution reactions being self-limiting. Self-limiting means that only a limited thickness of the ruthenium at the surface is modified or removed, regardless of how long a given etch solution is in contact with the ruthenium surface.

While ruthenium chloride ($RuCl_3$) and other ruthenium halides and oxyhalides provide a well-behaved, self-limiting modified surface layer for ruthenium wet ALE, they are not the only option available for creating a self-limiting passivation layer on the ruthenium surface. An alternative chemistry for ruthenium wet ALE may be used to form a self-limiting ruthenate salt or a perruthenate salt passivation layer. In some embodiments, a ruthenate salt or a perruthenate salt may be formed during the surface modification step 100 by exposing the ruthenium surface to an oxidizing solution containing an oxidizer, an appropriate cation and a chlorine source that is reactive to ruthenium, such as concentrated hydrochloric acid (HCl). For example, the Ru surface may exposed to an aqueous surface modification solution containing ammonium persulfate (APS) or tetrabutylammonium peroxymonosulfate (TBAPMS) as an oxidizer in concentrated HCl solution. Additionally, a salt such as tetramethyl ammonium chloride (TMAC) or 1-butyl-3-methylimidizolium chloride may be present in aqueous solution to provide the cations needed for the ruthenium salt formation. The oxidation of ruthenium in an HCl solution leads to the formation of a ruthenium salt passivation layer containing $RuO_xCl_y^{z-}$ polyanions. The HCl acts as a mild reducing agent and limits the final oxidation state of the ruthenium. Thus, the ruthenium species formed on the surface can be controlled by the concentration of HCl in the oxidizing solution. Additionally, the solubility of the ruthenium salt can be controlled by the counter-ion coordinating with the ruthenium polyanion in the salt. Thus, the solubility of the ruthenium salt passivation layer can be controlled by the HCl concentration, as well as the cations present in the oxidizing solution. In one example experiment, a stable passivation layer was formed with an HCl concentration of 6M, and using TMAC as the salt species.

After the insoluble ruthenium salt passivation layer is formed on the ruthenium surface, it can be removed via solvent exchange or ion exchange in a subsequently performed dissolution step 140. In the solvent exchange dissolution method, the insoluble ruthenium salt passivation layer is dissolved in a pure solvent (such as, e.g., trichlorobenzene) to remove the passivation layer from the ruthenium surface. In the ion exchange dissolution method, the insoluble ruthenium salt passivation layer is removed using ion exchange to improve the solubility of the ruthenium salt passivation layer in the aqueous solution used to form the passivation layer. For example, the ruthenium salt passivation layer can be removed from the ruthenium surface by exchanging $Me_4N+$ cations with K+ cations. This ion exchange improves the solubility of the ruthenium salt passivation layer, so that it can be dissolved within the aqueous surface modification solution.

The new etch chemistries used in the '342 Patent for etching ruthenium in a wet ALE process either: (a) primarily use halogenation to form an insoluble ruthenium halide or oxyhalide passivation layer, which is selectively removed via ligand-assisted dissolution, or (b) use oxidation in a concentrated HCl solution containing a chloride salt to form an insoluble ruthenium salt passivation layer, which is selectively removed by solvent or ion exchange. Unlike conventional etch chemistries for etching ruthenium, the etch chemistries described herein avoid forming a ruthenium metal-oxide (e.g., a $RuO_2$ or $RuO_4$) passivation layer on the ruthenium surface during the surface modification step 100. The etch chemistries disclosed above are also metal-free, cost-effective and improve surface roughness during etching.

Figure 2A:
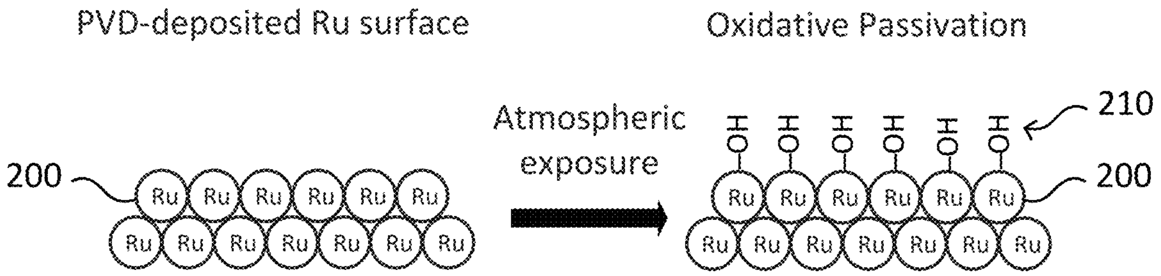
FIG. 2A is a schematic diagram of a ruthenium (Ru) layer deposited via physical vapor deposition (PVD) and the oxidative changes that occur on the ruthenium surface upon atmospheric exposure.
Figure 2B:
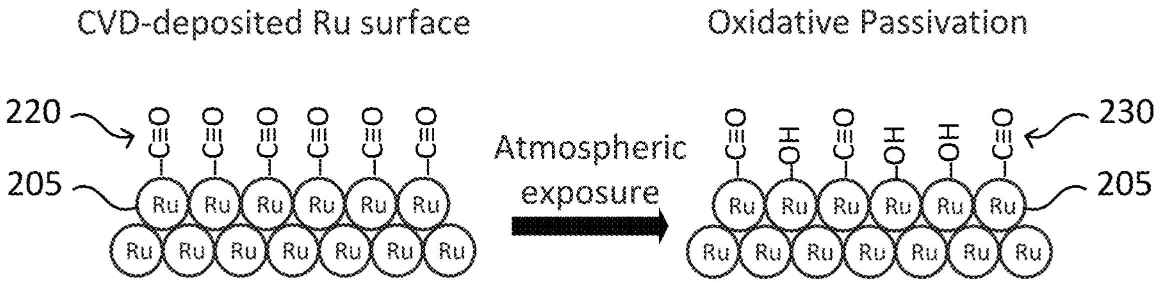
FIG. 2B is a schematic diagram of a ruthenium (Ru) layer deposited via chemical vapor deposition (CVD) and the oxidative changes that occur on the ruthenium surface over time with atmospheric exposure.

While the etch chemistries disclosed in the '342 Patent provide numerous advantages over traditional ruthenium wet etch chemistries, they are very sensitive to the surface chemistry on the ruthenium surface. The surface chemistry depends, not only on the deposition methods and chemistries used to form a ruthenium layer on a substrate, but also on the post-deposition conditions (e.g., exposure to air) and processing steps performed on the substrate after deposition of the ruthenium layer (e.g., a post-deposition anneal, chemical oxidation process, or etch process used to etch the ruthenium layer). For example, FIG. 2A demonstrates how a ruthenium layer deposited via PVD may initially leave the ruthenium surface 200 un-passivated. When the substrate is removed from the deposition chamber, air exposure oxidatively passivates the ruthenium surface 200, forming a passivation layer 210 comprising an oxide, hydroxide or hydrate group on the ruthenium surface 200. Alternatively, FIG. 2B shows CVD deposition of ruthenium layers using a ruthenium carbonyl precursor leave carbonyl groups 220 (e.g., CO ligands) on the ruthenium surface 205. Over time and atmospheric exposure, the carbonyl groups 220 may be slowly displaced and re-passivated with an oxide, hydroxyl, or hydrate group, forming a mixed-valence passivation layer 230 on the ruthenium surface 205, as shown for example in FIG. 2B.

Etch experiments performed on CVD and PVD-deposited ruthenium layers show that ruthenium layers deposited by CVD etch much faster than those deposited by PVD when the etch is performed immediately after deposition. This is likely due to the carbonyl groups 220 formed on the ruthenium surface 205 of the CVD-deposited ruthenium layers being easier to etch than the oxide, hydroxide or hydrate groups formed on the ruthenium surface 200 of the PVD-deposited ruthenium layers. However, the etch rate of the CVD-deposited ruthenium was also found to decrease over time under atmospheric conditions, indicating that oxidative degradation plays a role in hindering the etch.

Figure 3:
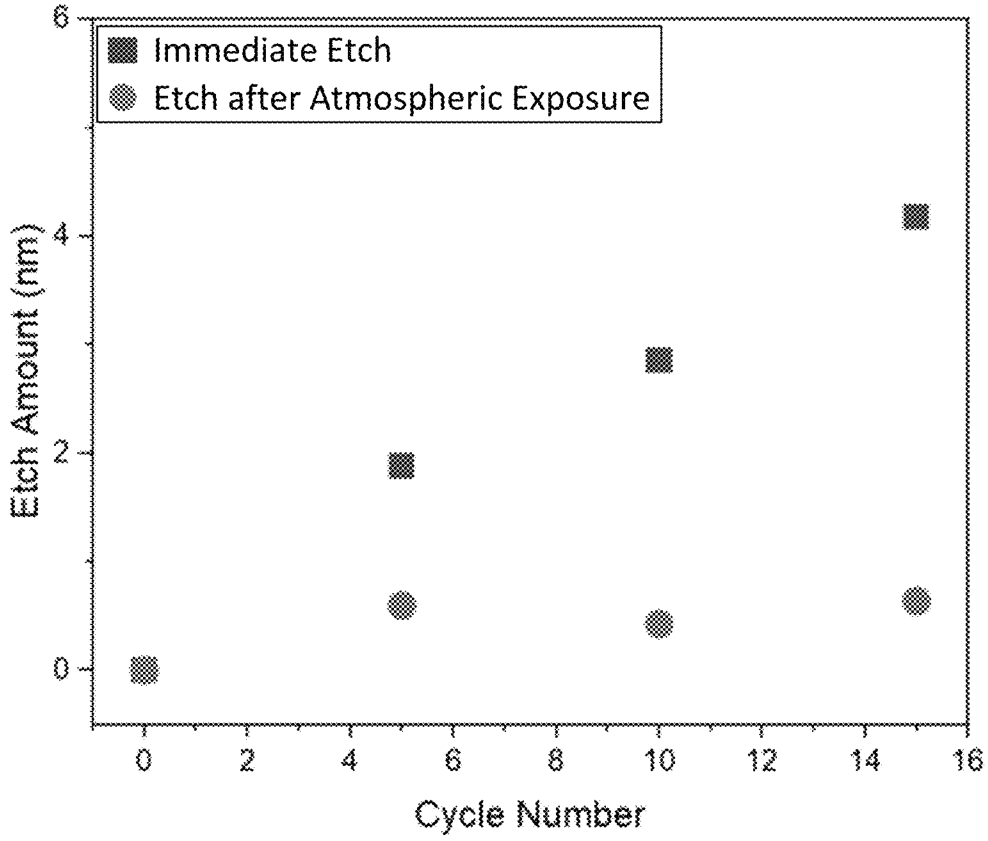
FIG. 3 is a graph illustrating exemplary etch rates (expressed in nm/cycle) achieved for a CVD-deposited ruthenium layer etched immediately after deposition and after long term atmospheric exposure.

The graph 300 shown in FIG. 3 depicts exemplary etch rates (expressed in nm/cycle) achieved for a CVD-deposited ruthenium layer etched immediately after deposition and after long-term atmospheric exposure (e.g., after approximately ~9 months of storage). As shown in the graph 300, the etch rate of the same CVD-deposited ruthenium layer decreased from 0.29 nm/cycle to 0.04 nm/cycle after long-term atmospheric exposure. The etch conditions were identical for both test dates. The change in etch behavior for the CVD-deposited ruthenium layer over time is attributed to oxidative degradation of the carbonyl groups 220 initially formed on the ruthenium surface 205. As noted above, the CO ligands bound to the ruthenium surface 205 are displaced over time, and the ruthenium surface 205 is quickly re-passivated with an oxide, hydroxyl, or hydrate group, forming a mixed-valence passivation layer 230. This is an irreversible process under atmospheric conditions.

New methods are provided herein to condition a surface of a metal layer, prior to etching the metal layer, to optimize etching of the metal layer during a wet etch process. In the methods disclosed herein, a surface of a metal layer is conditioned by forming a passivation layer (e.g., a carbonyl passivation layer or another passivation layer) on the metal surface prior to etching the metal layer with a wet etch chemistry optimized for the bulk metal layer. In some embodiments, the passivation layer may increase the etch rate of the metal layer by: (a) reversing oxidative passivation of the metal surface that may occur with atmospheric exposure (either immediately or over time) or other processing steps performed prior to etching, and/or (b) preventing oxidative passivation of the metal surface during the wet etch process.

The passivation layer disclosed herein may be used to optimize etching of a wide variety of metal layers deposited using various deposition techniques (e.g., CVD, PVD, ALD, etc.). In some embodiments, a carbonyl passivation layer may be formed on a surface of a ruthenium (Ru) layer deposited via CVD or PVD to condition the ruthenium surface prior to etching the ruthenium layer with an etch chemistry optimized for the bulk ruthenium layer. In doing so, the carbonyl passivation layer may increase the etch rate and optimize the ruthenium wet etch process.

Figure 4A:
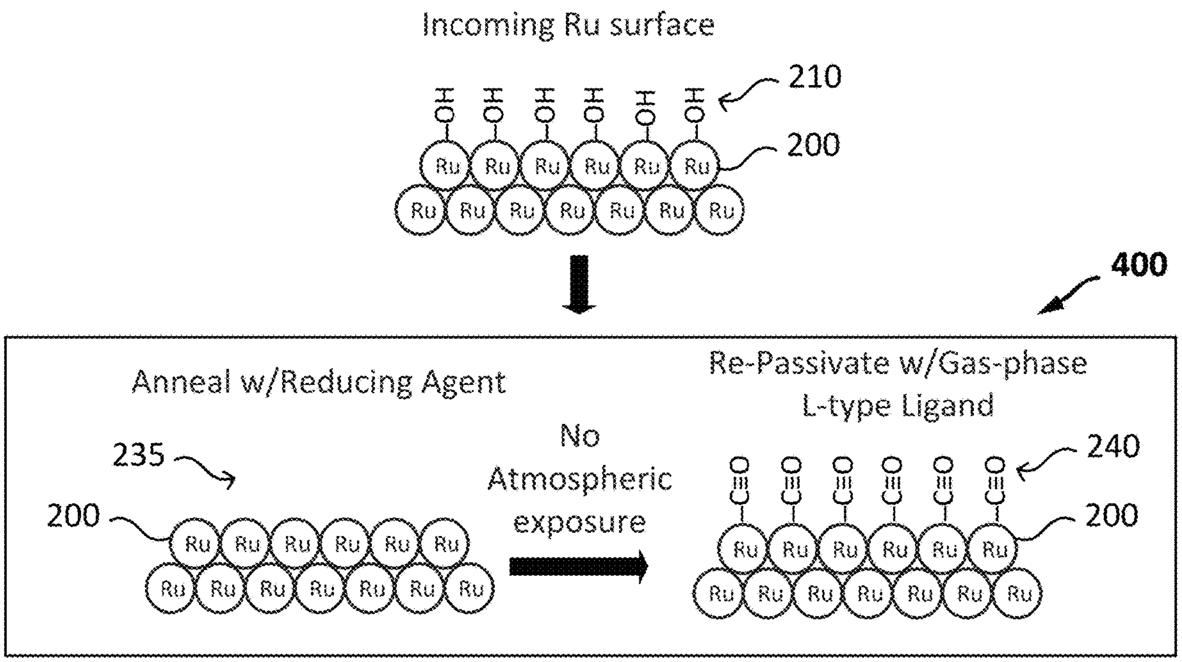
FIG. 4A is a schematic diagram of process steps that can be used to condition a PVD-deposited ruthenium surface by forming a carbonyl passivation layer on the ruthenium surface.

FIG. 4A illustrates a process flow 400 used to condition a PVD-deposited ruthenium layer by forming a carbonyl passivation layer on the ruthenium surface prior to etching. As noted above and shown in FIGS. 2A and 4A, an incoming ruthenium surface 200 of a PVD-deposited ruthenium layer may have a passivation layer 210 comprising an oxide, hydroxide or hydrate group formed thereon. The passivation layer 210 can be removed from the incoming ruthenium surface 200 in the process flow 400 by annealing the substrate in a reducing atmosphere.

Figure 4B:
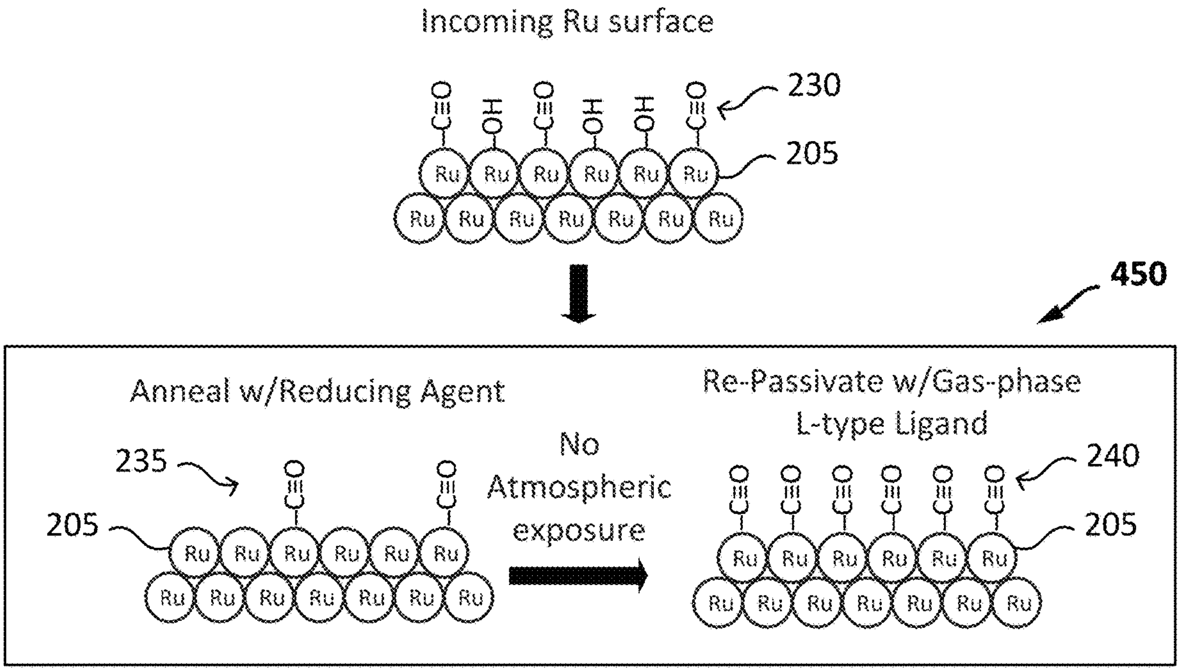
FIG. 4B is a schematic diagram of process steps that can be used to condition a CVD-deposited ruthenium surface by re-passivating the ruthenium surface with a carbonyl passivation layer.

FIG. 4B illustrates a process flow 450 used to condition a CVD-deposited ruthenium layer by forming a carbonyl passivation layer on the ruthenium surface prior to etching. As noted above and shown in FIGS. 2B and 4B, an incoming ruthenium surface 205 of a CVD-deposited ruthenium layer may have a mixed-valence passivation layer 230 formed thereon if the CVD-deposited ruthenium layer is not etched immediately after deposition. For example, the mixed-valence passivation layer 230 may comprise a mixture of bound CO ligands and oxide, hydroxyl or hydrate groups, as a result of oxidative degradation of the ruthenium surface 205 or other processing steps performed prior to etching. Like the previous process 400 shown in FIG. 4A, the mixed-valence passivation layer 230 can be removed from the incoming ruthenium surface 205 in the process flow 450 by annealing the substrate in a reducing atmosphere.

As used herein, a substrate is annealed in a reducing atmosphere by exposing the substrate to a gaseous reducing agent and a relatively high temperature. As known in the art, a "reducing agent" is a chemical species that reduces another element, molecule or compound by donating an electron to the other element, molecule or compound (i.e., an electron recipient) during an oxidation-reduction reaction. During the reaction, the reducing agent loses an electron to, and absorbs oxygen (O) from, the electron recipient. In doing so, the reducing agent becomes oxidized and the electron recipient becomes reduced (by losing an oxygen atom). In the embodiments disclosed herein, the gaseous reducing agent used during the anneal step may at least partially reduce the incoming ruthenium surface 200/205 by desorbing oxygen-containing ligands (e.g., oxide, hydroxide or hydrate groups) bound to the ruthenium surface 200/205.

Figure 5B:
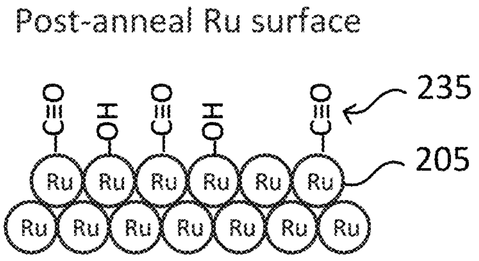
FIG. 5B is a schematic diagram illustrating an example post-anneal ruthenium surface after an $H_2$ anneal at 150 °C.
Figure 6B:
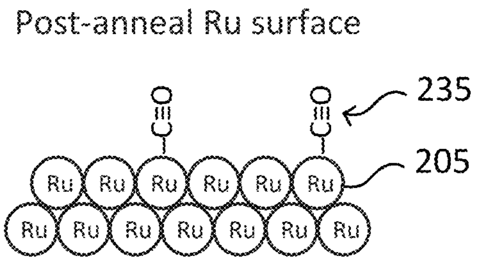
FIG. 6B is a schematic diagram illustrating an example post-anneal ruthenium surface after an $H_2$ anneal at 250 °C.
Figure 7A:
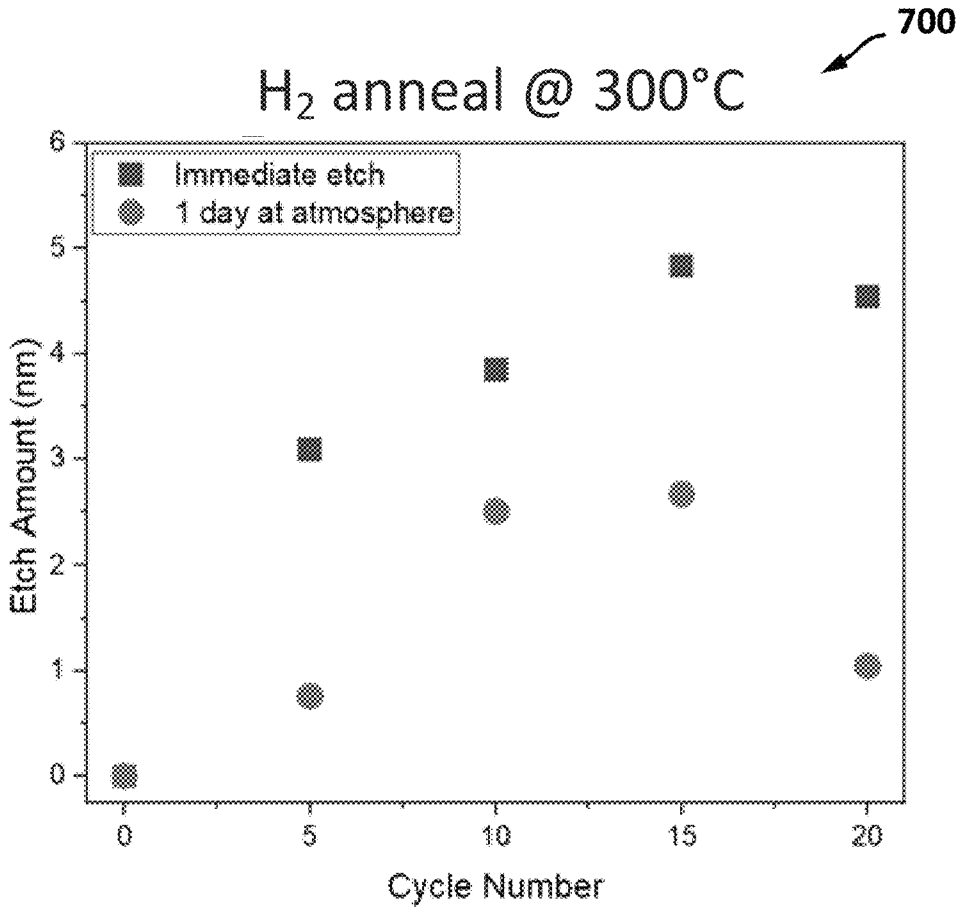
FIG. 7A is a graph illustrating exemplary etch rate (expressed in nm/cycle) achieved for a CVD-deposited ruthenium coupon etched after an $H_2$ anneal at 300 °C., both: (a) immediately after the $H_2$ anneal, and (b) 1 day after atmospheric exposure.
Figure 7B:
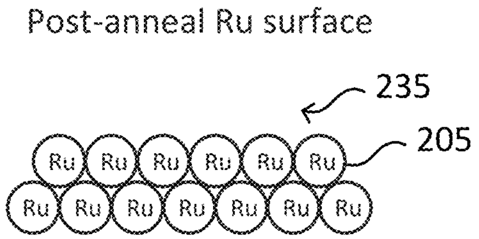
FIG. 7B is a schematic diagram illustrating an example post-anneal ruthenium surface after an $H_2$ anneal at 300 °C.

In some embodiments, the gaseous reducing agent may fully reduce the ruthenium surface 200/205 by desorbing all ligand groups bound to the ruthenium surface 200/205, leaving a relatively clean post-anneal ruthenium surface 235 as shown in FIG. 4A (for the PVD-deposited ruthenium layer) and FIG. 7B (for the CVD-deposited ruthenium layer). In other embodiments, the gaseous reducing agent may partially reduce the post-anneal ruthenium surface 200/205 by desorbing some (but not all) of the ligand groups bound to the ruthenium surface 200/205, leaving a partially reduced post-anneal ruthenium surface 235 as shown in FIGS. 4B, 5B or 6B (for the CVD-deposited ruthenium layer).

A wide variety of gaseous reducing agents can be used to in the anneal step. Examples of gaseous reducing agents include, but are not limited to, hydrogen ($H_2$), hydrazine ($N_2H_4$), carbon monoxide (CO), ammonia ($NH_3$), methane ($CH_4$), formic acid ($CH_2O_2$) and other volatile carboxylic acids. In one example embodiment, the incoming ruthenium surface 200/205 may be annealed by exposing the substrate to a relatively high temperature ranging, for example, between 150 °C. and 250 °C., in a hydrogen ($H_2$) gas ambient. Relatively high temperatures are required to thermally activate hydrogen as a reducing agent. During the anneal, the $H_2$ gas (i.e., the reducing agent) at least partially reduces the ruthenium surface 200/205 by desorbing oxide, hydroxide or hydrate groups bound to the ruthenium surface 200/205. The amount of reduction may generally depend on the reducing agent and temperature used during the anneal step, as described in more detail below in reference to FIGS. 5-7. Some of the CO ligands bound to the ruthenium surface 205 may also be desorbed, depending on the temperature used during the anneal step.

After annealing the substrate in a reducing atmosphere to at least reduce the ruthenium surface, the process flows 400 and 450 shown in FIGS. 4A and 4B may re-passivate the post-anneal ruthenium surface 235 by exposing the substrate to a gas-phase L-type ligand to form a passivation layer 240 on the post-anneal ruthenium surface 235. L-type ligands are neutral molecules that donate a pair of electrons to a metal center, acting as electron pair donors without changing the formal oxidation state of the metal. A wide variety of gas-phase L-type ligands can be used during the re-passivation step to form a passivation layer 240 on the post-anneal ruthenium surface 235. For example, the gas-phase L-type ligand may be carbon monoxide (CO), in one embodiment. When CO gas is used to re-passivate the post-anneal ruthenium surface 235, the passivation layer 240 formed on the post-anneal ruthenium surface 235 may be a carbonyl passivation layer, as shown in FIGS. 4A and 4B. However, other passivation layers may be formed on the post-anneal ruthenium surface 235 when other gas-phase L-type ligands are used. In other embodiments, the gas-phase L-type ligand may comprise a wide variety of alkenes (such as cyclohexadiene ($C_6H_8$) and other dienes), ammonia ($NH_3$), alkyl amines, or phosphines. Exposing the post-anneal ruthenium surface 235 to such ligands may result in the formation of cyclohexadiene-based passivation layers, phosphine-based passivation layers, etc.

In one example embodiment, the post-anneal ruthenium surface 235 may be exposed to carbon monoxide (CO) gas during the re-passivation step to form a thermally stable carbonyl passivation layer on the post-anneal ruthenium surface 235. CO has a strong affinity for many metals, including noble metals, such as ruthenium. Very low partial pressures of CO (e.g., <1 Torr) can be used to irreversibly saturate a partially or fully reduced post-anneal ruthenium surface 235 during the re-passivation step. Once formed, the carbonyl passivation layer may be thermally stable below about 75 °C. However, the carbonyl passivation layer may partially desorb at higher temperatures (above ~75 °C.) until about 250 °C. where catalytic decomposition of CO remaining on the surface begins. As such, CO re-passivation is preferably performed at relatively low temperature (e.g., <75 °C.), and without air exposure or other opportunity for oxidation, between the annealing and re-passivation steps.

The process flows 400 and 450 shown in FIGS. 4A and 4B condition a ruthenium surface exposed on a substrate by: (a) annealing the substrate in a reducing atmosphere to at least partially reduce the ruthenium surface by desorbing oxide, hydroxide or hydrate groups bound to the ruthenium surface, and (b) exposing the substrate to a gas-phase L-type ligand to form a carbonyl passivation layer on the post-anneal ruthenium surface. As noted above, annealing the substrate in a reducing atmosphere may partially or fully reduce the ruthenium surface, depending on the reducing agent and temperature used during the anneal step.

Etching experiments were conducted to investigate results of annealing ruthenium films in a hydrogen ($H_2$) atmosphere. Annealing was performed by placing CVD-deposited ruthenium coupons in a cold-wall reactor with a heated chuck. The chamber was evacuated to <1e−5 Torr before backfilling to 25 Torr with forming gas. The partial pressure of hydrogen in the chamber was approximately 1.25 Torr. After the chuck holding a ruthenium coupon reached a desired temperature (e.g., 150 °C., 250 °C. or 300 °C.), it was allowed to cool naturally in the $H_2$ ambient. After removal from the chamber, half of the CVD-deposited ruthenium coupon was etched immediately, while the other half was etched 24 hours after atmospheric exposure.

Figure 5A:
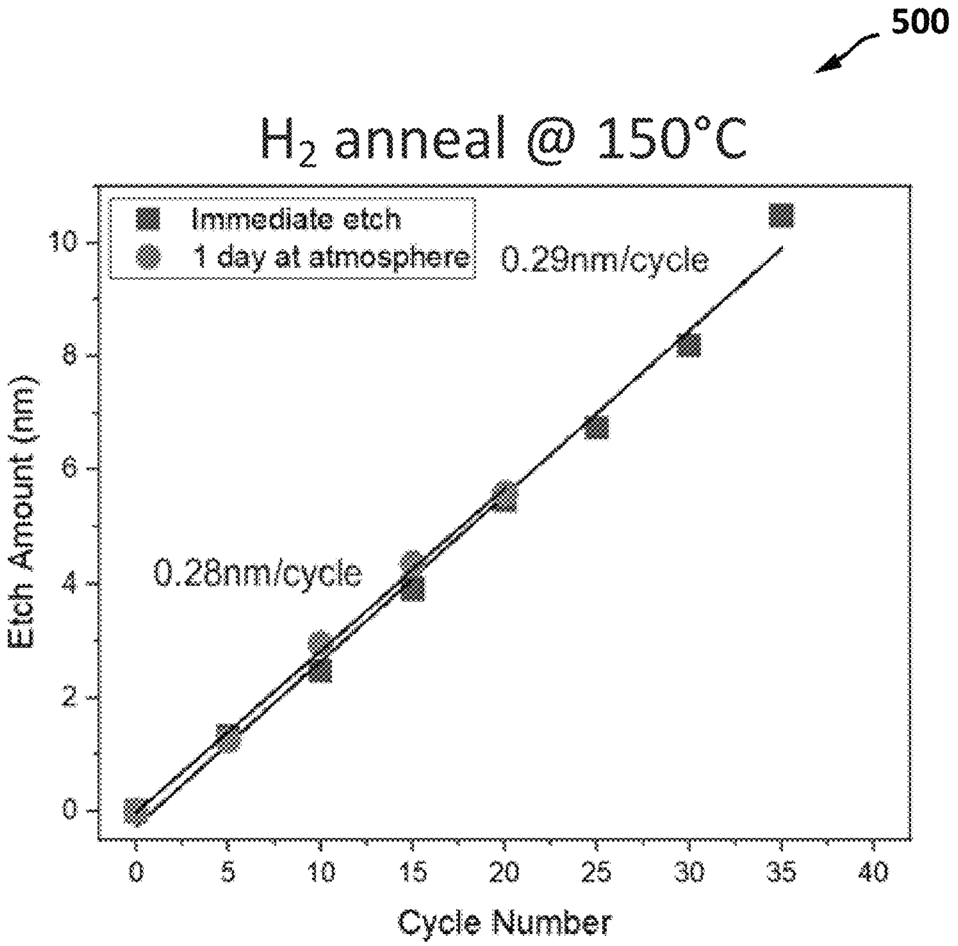
FIG. 5A is a graph illustrating exemplary etch rate (expressed in nm/cycle) achieved for a CVD-deposited ruthenium coupon etched after a hydrogen ($H_2$) anneal at 150 °C., both: (a) immediately after the $H_2$ anneal, and (b) 1 day after atmospheric exposure.

The graph 500 shown in FIG. 5A depicts the etch rate (expressed in nm/cycle) achieved for a CVD-deposited ruthenium coupon etched after an $H_2$ anneal at 150 °C., both: (a) immediately after the $H_2$ anneal, and (b) 1 day after atmospheric exposure. As shown in FIG. 5A, the ruthenium coupon etched immediately after the $H_2$ anneal at 150 °C. shows an increase in etch rate (e.g., 29 nm/cycle) compared to the etch rates achieved in FIG. 3. The graph 500 further shows that the increase in etch rate (e.g., 28 nm/cycle) was retained after 24 hours at atmosphere. It's likely that the post-anneal ruthenium surface 235 was only partially reduced at this temperature, as depicted in the example shown in FIG. 5B. Carbonyl groups remaining on the post-anneal ruthenium surface 235 after annealing at 150 °C. may also contribute to the increase in etch rate.

Figure 6A:
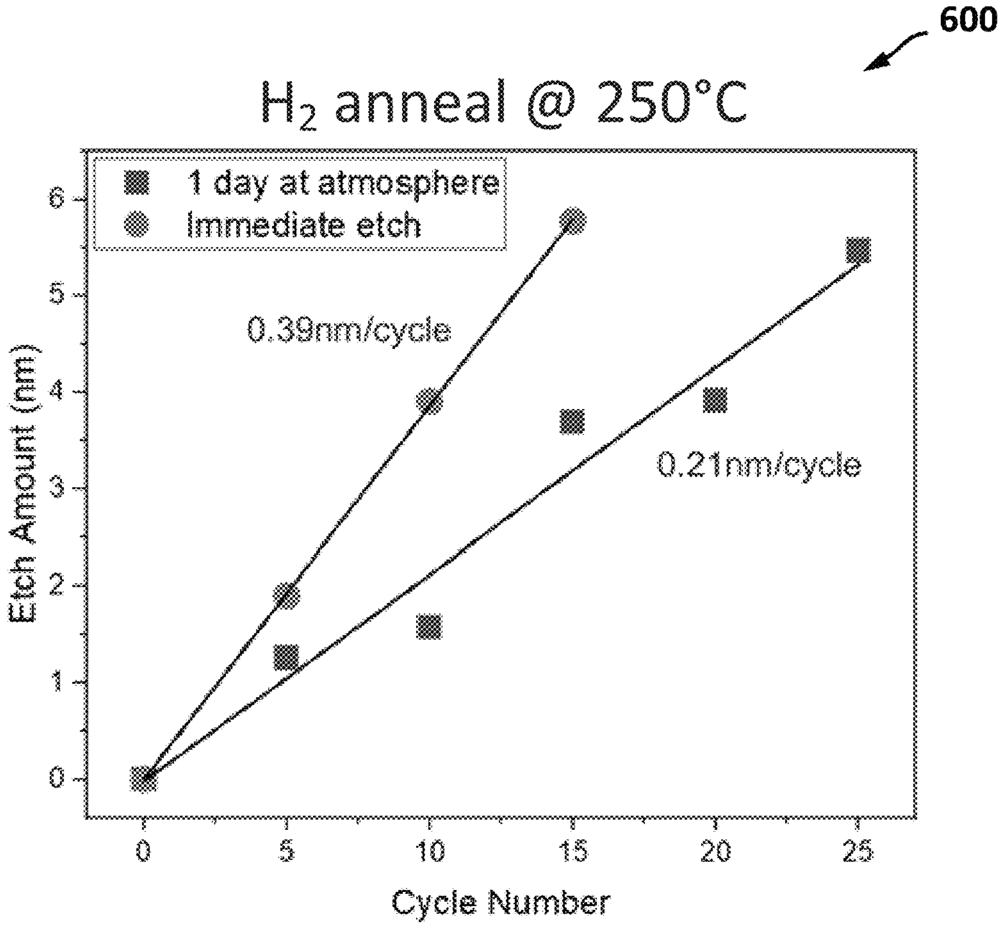
FIG. 6A is a graph illustrating exemplary etch rate (expressed in nm/cycle) achieved for a CVD-deposited ruthenium coupon etched after an $H_2$ anneal at 250 °C., both: (a) immediately after the $H_2$ anneal, and (b) 1 day after atmospheric exposure.

The graph 600 shown in FIG. 6A depicts the etch rate (expressed in nm/cycle) achieved for a CVD-deposited ruthenium coupon etched after an $H_2$ anneal at 250 °C., both: (a) immediately after the $H_2$ anneal, and (b) 1 day after atmospheric exposure. As shown in FIG. 6A, the ruthenium coupon etched immediately after the $H_2$ anneal at 250 °C. shows a larger increase in etch rate (e.g., 39 nm/cycle) compared to the etch rates achieved in FIG. 3. However, the etch rate achieved after 24 hours at atmosphere (e.g., 21 nm/cycle) was nearly cut in half. The etch results shown in the graph 600 are consistent with a more complete reduction of the ruthenium surface 205, but also a partial desorption of the carbonyl groups 220 present on the ruthenium surface 205 before annealing, as shown in the comparison of FIGS. 2B and 6B. The decrease in etch rate after 24 hours at atmosphere (e.g., 39 nm/cycle to 21 nm/cycle) may be attributed to the desorption of the carbonyl groups 220 at the higher anneal temperature (e.g., 250 °C. vs 150 °C.), as this may allow faster re-oxidation of the ruthenium surface 205, compared to the ruthenium coupon annealed to 150 °C.

The graph 700 shown in FIG. 7A depicts the etch rate (expressed in nm/cycle) achieved for a CVD-deposited ruthenium coupon etched after an $H_2$ anneal at 300 °C., both: (a) immediately after the $H_2$ anneal, and (b) 1 day after atmospheric exposure. As shown in FIG. 7A, the ruthenium coupon annealed to 300 °C. shows saturating etch behavior for the coupons etched immediately and after 24 hours of atmospheric exposure, with even lower etch rates achieved after 24 hours of atmospheric exposure. This could indicate both full reduction of the post-anneal ruthenium surface 235 and complete desorption of carbonyl groups, as shown in the example provided in FIG. 7B. This leaves the post-anneal ruthenium surface 235 completely open to rapid re-oxidation on the timescale of the etch experiments.

This post-anneal etch data shown in FIGS. 5A, 6A and 7A suggests that the loss of etch activity is due to an oxidative process. Annealing in a reducing atmosphere is enough to at least partially regain previous etch behavior. However, there is a tradeoff between the peak etch rate achieved immediately after annealing, and the timescale for re-oxidation of the ruthenium surface. As shown in FIGS. 5A, 6A and 7A, higher annealing temperatures lead to faster initial etch rates, but also faster surface re-oxidation. This indicates that an additional surface re-passivation step may be necessary to fully recover both the high etch rates and the oxidation resistance that the CVD-deposited ruthenium films possessed immediately after deposition. This re-passivation can be accomplished by exposing the substrate to a gas-phase L-type ligand (such as, e.g., CO gas) to form a carbonyl passivation layer 240 on the post-annealed ruthenium surface 235, as shown in FIGS. 4A and 4B. Alternatively, the substrate can be exposed to other gas-phase L-type ligands to re-passivate the post-annealed ruthenium surface 235.

In some embodiments, the passivation layer formed on the post-annealed ruthenium surface 235 may optimize the ruthenium wet etch process by reversing oxidative surface passivation of ruthenium layers deposited using various deposition techniques (e.g., CVD, PVD, ALD, etc.). For example, PVD-deposited ruthenium films will lack any passivation layer, as deposited. Since any exposure to atmosphere will quickly oxidatively passivate the ruthenium surface 200, wet etch processes used to etch PVD-deposited ruthenium films should be preceded by an $H_2$ anneal and CO exposure step to form a carbonyl passivation layer on the post-anneal ruthenium surface 235 prior to etching the ruthenium film. On the other hand, CVD-deposited ruthenium films using ruthenium carbonyl as a precursor should be carbonyl passivated, as deposited. As such, the surface conditioning techniques described herein may only be applicable to CVD-deposited ruthenium films if they have been annealed to temperatures above ~75°C., or have been exposed to oxidizing environments, even atmospheric conditions.

In some embodiments, the passivation layer 240 formed on the post-annealed ruthenium surface 235 may increase the etch rate of the ruthenium layer, compared to an etch rate achieved without the passivation layer, when a wet etch chemistry that primarily uses halogenation, rather than oxidation, is used to chemically modify the ruthenium surface and form a ruthenium halide or oxyhalide passivation layer on the ruthenium surface.

For example, and as noted above with regard to the wet ALE process shown in FIG. 1, TCCA can be used as a chlorinating agent to form a ruthenium chloride passivation layer on the ruthenium surface, which is self-limiting and insoluble in the surface modification solution 115, but freely soluble in the dissolution solution 145. Thermodynamically, exposing the ruthenium surface to TCCA should lead to the formation of a ruthenium trichloride ($RuCl_3$) passivation layer in the 3+ oxidation state. However, TCCA is susceptible to hydrolysis by surface hydroxides and hydrates. Hydrolysis of TCCA forms hypochlorous acid (HClO), which is a well-known oxidizer capable of forming ruthenium dioxide ($RuO_2$) on the ruthenium surface. Since $RuO_2$ is in the 4+ oxidation state, it must be reduced to form a ruthenium halide passivation layer. However, TCCA cannot act as a reducing agent, so the presence of $RuO_2$ on the ruthenium surface will poison the etch and decrease the etch rate. Surface hydroxides and hydrates can also be harmful to the etch. Thus, any oxidative passivation of the ruthenium surface is capable of poisoning the halogenation reaction by TCCA.

In some embodiments, the passivation layer 240 formed on the post-annealed ruthenium surface 235 may optimize the ruthenium wet etch process by: (a) reversing and/or preventing oxidative surface passivation of the ruthenium layer, and (b) keeping surface ruthenium atoms in the zero valent state when using halogenating etch chemistries to etch the ruthenium layer. During the halogenation reaction, the zero valent metal centers are open to oxidation to the 3+ state to form a ruthenium halide or oxyhalide passivation layer on the ruthenium surface. For example, TCCA may oxidize the ruthenium surface to from a ruthenium chloride (e.g., $RuCl_3$) passivation layer in the 3+ oxidation state. The passivation layer 240 formed on the post-annealed ruthenium surface 235 prevents hydrolysis of TCCA through reactions with surface hydroxyl or hydrate groups, and thus, prevents $RuO_2$ formation and oxidation states higher than 3+. In doing so, the passivation layer 240 optimizes the ruthenium wet etch process by preventing conditions that poison the etch.

Figure 8:
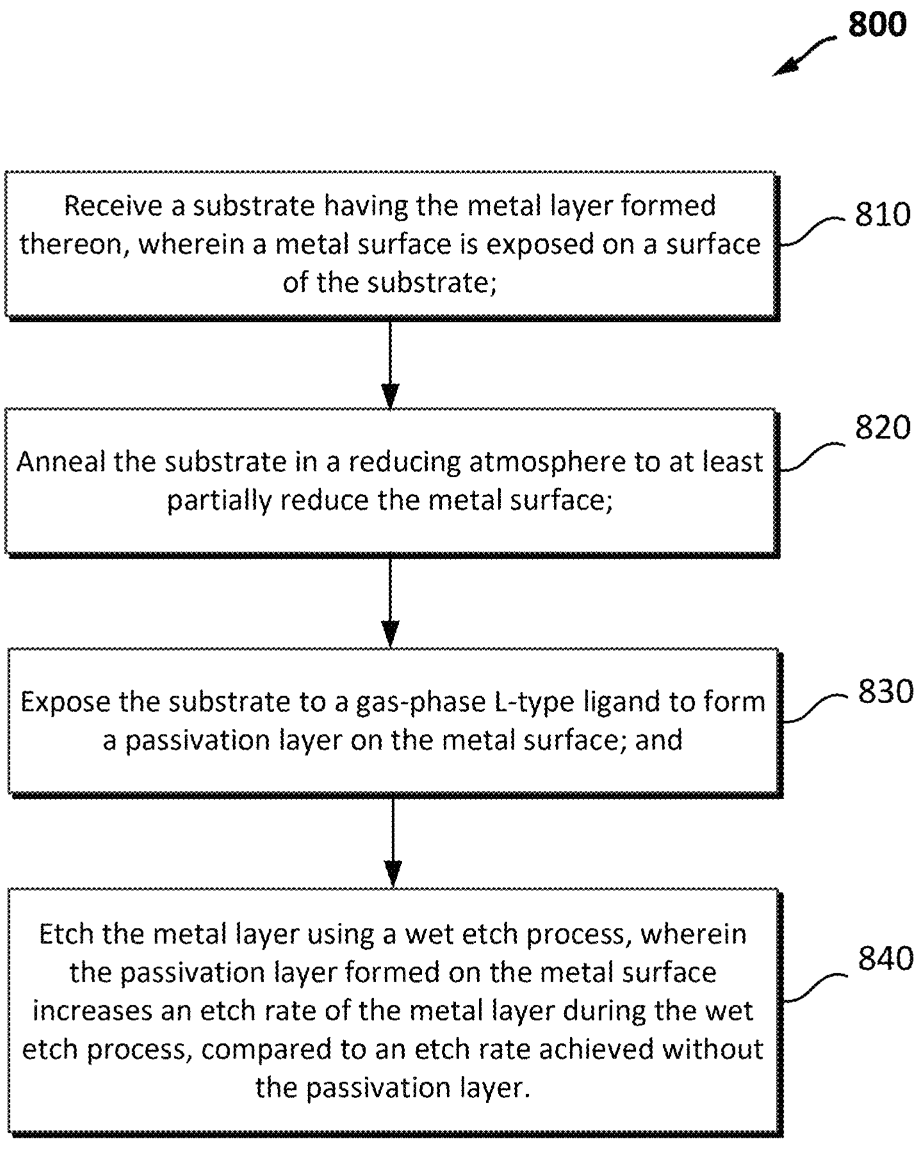
FIG. 8 is a flowchart diagram illustrating one embodiment of a method that utilizes the techniques described herein.
Figure 9:
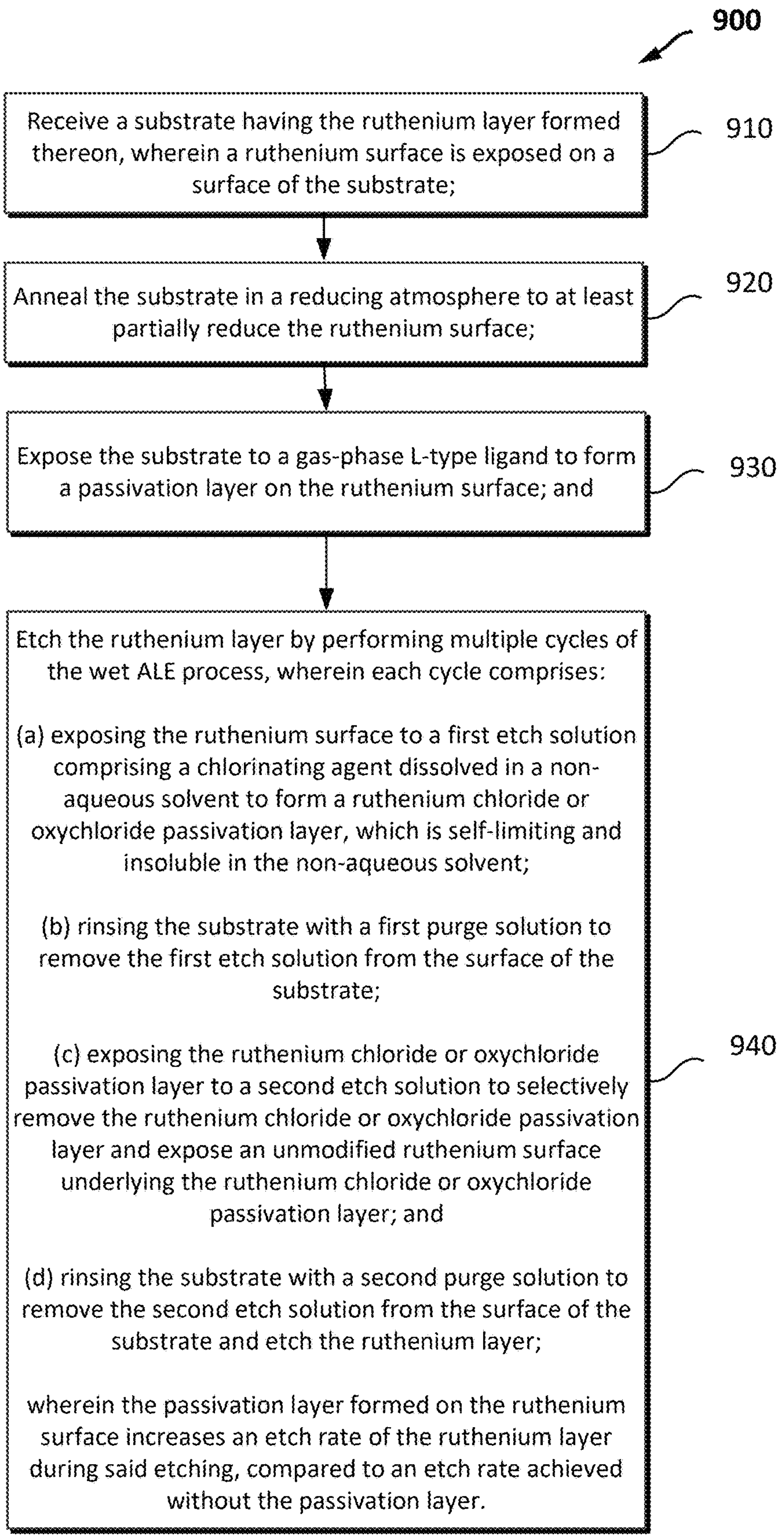
FIG. 9 is a flowchart diagram illustrating another embodiment of a method that utilizes the techniques described herein.

FIGS. 8-9 illustrate exemplary methods that utilize the techniques disclosed herein to condition a surface of a metal layer to be etched prior to etching the metal layer. In some embodiments, the methods shown in FIGS. 8-9 may be used to condition a surface of a ruthenium (Ru) layer to be etched prior to etching the ruthenium layer in a wet atomic layer etching (ALE) process. It will be recognized that the embodiments of FIGS. 8-9 are merely exemplary and additional methods may utilize the techniques described herein. Further, additional processing steps may be added to the methods shown in the FIGS. 8-9 as the steps described are not intended to be exclusive. Moreover, the order of the steps is not limited to the order shown in the figures as different orders may occur and/or various steps may be performed in combination or at the same time.

FIG. 8 illustrates one embodiment of a method 800 that can be used to condition a surface of a metal layer to be etched prior to etching the metal layer. The method 800 may generally begin by receiving a substrate having the metal layer formed thereon, wherein a metal surface is exposed on a surface of the substrate (in step 810). The metal layer formed on the substrate may be a transition metal. For example, the metal layer may be a ruthenium (Ru) layer, a cobalt (Co) layer, a copper (Cu) layer, a tungsten (W) layer, a molybdenum (Mo) layer, a tantalum (Ta) layer, a niobium (Nb) layer, a titanium (Ti) layer, a zirconium (Zr) layer or a hafnium (Hf) layer.

In one example embodiment, the metal layer is a ruthenium (Ru) layer that was previously deposited on the substrate using various deposition techniques (e.g., CVD, PVD, ALD, etc.). As noted above, the surface chemistry of the ruthenium layer may differ depending on the deposition methods and chemistries used to form the ruthenium layer on the substrate, as well as the post-deposition conditions (e.g., exposure to air) and processing steps performed on the substrate after deposition of the ruthenium layer (e.g., a post-deposition anneal, chemical oxidation process, or etch process used to etch the ruthenium layer). For example, a ruthenium layer deposited via PVD may leave an unpassivated ruthenium surface 200, which is quickly re-passivated with an oxide, hydroxide or hydrate group upon exposure to air to form the passivation layer 210 shown, for example, in FIG. 2A. In another example, a ruthenium layer deposited via CVD using a ruthenium carbonyl precursor may initially leave carbonyl groups 220 on the ruthenium surface 205. However, the carbonyl groups 220 may be slowly re-passivated over time with oxide, hydroxyl, or hydrate groups, forming a mixed-valence passivation layer 230 on the ruthenium surface 205, as shown in FIG. 2B.

After receiving the substrate (in step 810), the method 800 may perform additional processing step(s) to condition the metal surface (i.e., change the surface chemistry of the metal surface) before etching the metal layer (in step 840). For example, the method 800 may condition the metal surface by: (a) annealing the substrate in a reducing atmosphere to at least partially reduce the metal surface (in step 820), and (b) exposing the substrate to a gas-phase L-type ligand to form a passivation layer on the metal surface (in step 830). As described further herein, the reducing atmosphere may partially or fully reduce the metal surface by desorbing oxide, hydroxide or hydrate groups bound to the metal surface. In some embodiments, the substrate may be exposed to the gas-phase L-type ligand (in step 830) immediately after the substrate is annealed (in step 820) without exposing the substrate to air (or other oxidizing environments) to prevent oxidative surface passivation before the metal surface is re-passivated with surface ligand groups. In some embodiments, the substrate may be exposed to a carbon monoxide (CO) gas (in step 830) to form a carbonyl passivation layer on the metal surface. In other embodiments, the substrate may be exposed to other gas-phase L-type ligands (such as, e.g., cyclohexadiene ($C_6H_8$) and other dienes, ammonia ($NH_3$), alkyl amines and phosphines) to form other passivation layers on the metal surface (in step 830).

After the passivation layer is formed (in step 830), the method 800 may etch the metal layer using a wet etch process (in step 840). In the method 800, the passivation layer formed in step 830 increases the etch rate of the metal layer during the wet etch process performed in step 840, compared to an etch rate that would have been achieved without the passivation layer. In some embodiments, the passivation layer may increase the etch rate of the metal layer by: (a) reversing oxidative passivation of the metal surface that occurred before the substrate was received in step 810, and/or (b) preventing oxidative passivation of the metal surface during the wet etch process performed in step 840.

A wide variety of wet etch processes can be used in step 840 to etch the metal layer. In some embodiments, the metal layer may be etched by performing multiple cycles of a wet atomic layer etching (ALE) process, wherein each cycle comprises: (a) exposing the metal surface to a first etch solution comprising a halogenation agent dissolved in a non-aqueous solvent to form a metal halide or oxyhalide passivation layer, which is self-limiting and insoluble in the non-aqueous solvent; (b) rinsing the substrate with a first purge solution to remove the first etch solution from the surface of the substrate; (c) exposing the metal halide or oxyhalide passivation layer to a second etch solution to selectively remove the metal halide or oxyhalide passivation layer and expose an unmodified metal surface underlying the metal halide or oxyhalide passivation layer; and (d) rinsing the substrate with a second purge solution to remove the second etch solution from the surface of the substrate and etch the metal layer. Examples of etch chemistries that can be used in the first etch solution and the second etch solution to etch a ruthenium metal layer are disclosed further herein. Although etch chemistries are disclosed herein for etching ruthenium in a wet ALE process, one skilled in the art would recognize how the techniques disclosed herein could be used to condition a surface of other metal layers prior to etching such layers using potentially other wet etch chemistries and/or processes.

FIG. 9 illustrates one embodiment of a method 900 that can be used to condition a surface of a ruthenium (Ru) layer to be etched prior to etching the ruthenium layer in a wet atomic layer etching (ALE) process. Like the previous method 800 shown in FIG. 8, the method 900 may generally include: (a) receiving a substrate having the ruthenium layer formed thereon, wherein a ruthenium surface is exposed on a surface of the substrate (in step 910), (b) annealing the substrate in a reducing atmosphere to at least partially reduce the ruthenium surface (in step 920), and (c) exposing the substrate to a gas-phase L-type ligand to form a passivation layer on the ruthenium surface (in step 930). As noted above, the reducing atmosphere may partially or fully reduce the ruthenium surface by desorbing oxide, hydroxide or hydrate groups bound to the ruthenium surface. In some embodiments, the substrate may be exposed to the gas-phase L-type ligand (in step 930) immediately after the substrate is annealed (in step 920) without exposing the substrate to air (or other oxidizing environments) to prevent oxidative surface passivation before the ruthenium surface is re-passivated with surface carbonyl groups. In some embodiments, the substrate may be exposed to a carbon monoxide (CO) gas (in step 930) to form a carbonyl passivation layer on the metal surface. In other embodiments, the substrate may be exposed to other gas-phase L-type ligands (such as, e.g., cyclohexadiene ($C_6H_8$) and other dienes, ammonia ($NH_3$), alkyl amines and phosphines) to form other passivation layers on the metal surface (in step 930).

After the passivation layer is formed (in step 930), the method 900 may further include etching the ruthenium layer by performing multiple cycles of the wet ALE process (in step 940), wherein each cycle comprises: (a) exposing the ruthenium surface to a first etch solution comprising a chlorinating agent dissolved in a non-aqueous solvent to form a ruthenium chloride or oxychloride passivation layer, which is self-limiting and insoluble in the non-aqueous solvent, (b) rinsing the substrate with a first purge solution to remove the first etch solution from the surface of the substrate, (c) exposing the ruthenium chloride or oxychloride passivation layer to a second etch solution to selectively remove the ruthenium chloride or oxychloride passivation layer and expose an unmodified ruthenium surface underlying the ruthenium chloride or oxychloride passivation layer, and (d) rinsing the substrate with a second purge solution to remove the second etch solution from the surface of the substrate and etch the ruthenium layer.

A wide variety of etch chemistries can be used in the first etch solution and the second etch solution to etch ruthenium in the method 900 shown in FIG. 9. For example, the first etch solution may include TCCA dissolved in non-aqueous solvent (such as, e.g., ethyl acetate, acetone, acetonitrile or a chlorocarbon) and the second etch solution may be an aqueous dissolution solution containing a ligand (such as, e.g., EDTA, IDA, DTPA or ACAC) and a base (such as, e.g., TMAH, KOH, NaOH, $NH_4OH$ or another strong base). Additional examples of etch chemistries that can be used to etch ruthenium (and other transition metals) are discussed in more detail above.

The passivation layer formed in step 930 optimizes the wet ALE process performed in step 940 by reversing oxidative passivation of the ruthenium surface and returning surface ruthenium atoms to the zero valent state. When the ruthenium surface is exposed to the first etch solution in sub-step (a) of step 940, the chlorinating agent included within the first etch solution oxidizes the ruthenium surface to from a ruthenium chloride or oxychloride passivation layer, which is self-limiting and insoluble in the non-aqueous solvent. In some embodiments, TCCA dissolved in ethyl acetate may be used in the first etch solution to form a ruthenium trichloride ($RuCl_3$) passivation layer having a 3+ oxidation state on the ruthenium surface. The passivation layer formed in step 930 prevents hydrolysis of TCCA through reactions with surface hydroxyl or hydrate groups, and thus, avoids forming ruthenium dioxide ($RuO_2$) and/or other ruthenium species having oxidation states higher than 3+ on the ruthenium surface. In doing so, the passivation layer formed in step 930 increases the etch rate of the ruthenium layer during the wet ALE process performed in step 940, compared to an etch rate that would have been achieved without the passivation layer.

In the methods 800 and 900 shown in FIGS. 8 and 9, a passivation layer is formed on a metal surface, such as a ruthenium surface, by: (a) annealing the substrate in a reducing atmosphere to at least partially reduce the metal surface (in steps 820 and 920), and (b) exposing the substrate to a gas-phase L-type ligand to form the passivation layer on the metal surface (in steps 830 and 930). The process conditions used during the anneal and re-passivation steps may generally depend on the metal layer being etched.

In some embodiments, the substrate may be exposed to a gaseous reducing agent and a first temperature ranging between 100 °C. and 500 °C. during the anneal steps 820 and 920. As noted above, a wide variety of gaseous reducing agents can be used during the anneal step to at least partially reduce the metal surface. For example, the gaseous reducing agent used during the anneal step may comprise hydrogen ($H_2$), hydrazine ($N_2H_4$), carbon monoxide (CO), ammonia ($NH_3$), methane ($CH_4$), formic acid ($CH_2O_2$) or another volatile carboxylic acid.

In one example embodiment, a substrate comprising a ruthenium surface may be annealed by exposing the substrate to a relatively high temperature (ranging, e.g., between 150 °C. and 250 °C.) in a hydrogen ($H_2$) gas ambient. The $H_2$ gas (i.e., the gaseous reducing agent) may at least partially reduce the ruthenium surface by desorbing oxide, hydroxide or hydrate groups bound to the ruthenium surface. The amount of reduction achieved may generally depend on the reducing agent and temperature used during the anneal step. For example, an $H_2$ anneal performed at 150 °C. may result in a partial reduction of the ruthenium surface, whereas an $H_2$ anneal performed at (or above) 250 °C. may result in a full reduction of the ruthenium surface, as shown in the experimental results depicted in FIGS. 5A, 6A and 7A. Other anneal temperatures within this range may also be used to provide a partial or full reduction of the ruthenium surface during the anneal step.

In some embodiments, the substrate may be exposed to a gas-phase L-type ligand and a second temperature ranging between 25 °C. and 400 °C. during the re-passivation steps 830 and 930. The second temperature may be less than the first temperature used during the anneal step, and may generally depend on the thermal stability of the passivation layer (or other passivation layer) formed during the re-passivation step.

In one example embodiment, a substrate comprising a ruthenium surface may be exposed to carbon monoxide (CO) gas and a temperature less than about 75 °C. during the re-passivation step to form a thermally stable carbonyl passivation layer on the ruthenium surface. As noted above, CO has a strong affinity for many metals, including transition metals, such as ruthenium. In some embodiments, CO gas may be used as a precursor gas and left on the ruthenium surface during the ruthenium deposition step. In such embodiments, CO gas may also be used during the re-passivation step. However, CO gas is not the only gas-phase L-type ligand with a strong affinity for ruthenium and other transition metal surfaces. For example, alkenes (such as cyclohexadiene ($C_6H_8$) and other dienes), ammonia ($NH_3$), alkyl amines and phosphines can also be used to form other passivation layers during the re-passivation step.

Once formed, the carbonyl passivation layer may be thermally stable below about 75 °C. However, the carbonyl passivation layer may partially desorb at higher temperatures (above ~75 °C.) until about 250 °C. where catalytic decomposition of CO remaining on the surface begins. As such, the re-passivation step is preferably performed at relatively low temperature (e.g., <75 °C. when CO gas is used to re-passivate the post-anneal ruthenium surface), and without air exposure or other opportunity for oxidation between the annealing and re-passivation steps.

In the example embodiments disclosed above, different gases (e.g., $H_2$ and CO) are used during the annealing and re-passivation steps to reduce and re-passivate the ruthenium surface. In other embodiments, the same gas (e.g., CO) may be used as a both a reducing agent and a carbonyl re-passivation agent. For example, the substrate may be exposed to CO gas at a relatively high anneal temperature (e.g., a temperature ranging between 150 °C. and 250 °C.) to at least partially reduce the ruthenium surface. After annealing at high temperature, the substrate may be cooled to a lower temperature (e.g., a temperature less than 75 °C.) in the CO gas ambient to form the carbonyl passivation layer on the ruthenium surface.

The present disclosure provides various embodiments of methods that can be used to condition a surface of a metal layer prior to etching the metal layer. In the embodiments disclosed herein, a metal surface is conditioned by forming a carbonyl passivation layer (or another passivation layer) on the metal surface prior to etching the metal layer with a wet etch chemistry optimized for the bulk metal layer. In some embodiments, a carbonyl passivation layer formed on a surface of a ruthenium layer may increase the etch rate of the ruthenium layer by: (a) reversing and/or preventing oxidative surface passivation of the ruthenium layer, and (b) keeping surface ruthenium atoms in the zero valent state when using halogenating etch chemistries (such as, e.g., TCCA-based chemistries) to etch the ruthenium layer.

The surface conditioning techniques and methods disclosed herein provide various advantages. For example, the passivation layer formed on the post-annealed ruthenium surface improves the etch rate of ruthenium films etched using TCCA-based wet ALE chemistry and improves etch uniformity between CVD and PVD-deposited ruthenium films. The passivation layer formed on the post-annealed ruthenium surface also improves wafer-to-wafer etch uniformity and reduces etch variations due to differences in queue time by recovering the original etch behavior lost after annealing, chemical oxidations, or other processing steps performed prior to etching.

Although described herein for conditioning ruthenium surfaces, the surface conditioning techniques and methods disclosed herein can be used to condition other metal surfaces, and may be particularly useful when a metal oxide or metal hydroxide formation hinders the etch. For example, the surface conditioning techniques and methods disclosed herein may be used to condition transition metal surfaces, such as ruthenium (Ru), cobalt (Co), copper (Cu), tungsten (W), molybdenum (Mo), tantalum (Ta), niobium (Nb), titanium (Ti), zirconium (Zr) or hafnium (Hf) surfaces, when using halogenating chemistries (such as TCCA) to etch the transition metal surface. However, the surface conditioning techniques and methods disclosed herein may be less useful when etching cobalt (Co), copper (Cu), molybdenum (Mo) and tungsten (W) with chemistries that incorporate oxygen, where metal-oxygen bonds are formed as part of the etch cycle.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for conditioning a surface of a metal layer to be etched prior to etching the metal layer, the method comprising:

receiving a substrate having the metal layer formed thereon, the metal layer having a metal surface exposed on a surface of the substrate;

annealing the substrate in a reducing atmosphere to at least partially reduce the metal surface;

exposing the substrate to a gas-phase L-type ligand to form a passivation layer on the metal surface; and etching the metal layer using a wet etch process, wherein the passivation layer formed on the metal surface increases an etch rate of the metal layer during the wet etch process, compared to an etch rate achieved without the passivation layer.

2. The method of claim 1, wherein the metal layer is a ruthenium (Ru) layer, a cobalt (Co) layer, a copper (Cu) layer, a tungsten (W) layer, a molybdenum (Mo) layer, a tantalum (Ta) layer, a niobium (Nb) layer, a titanium (Ti) layer, a zirconium (Zr) layer or a hafnium (Hf) layer.

3. The method of claim 2, wherein said etching the metal layer comprises performing multiple cycles of a wet atomic layer etching (ALE) process, wherein each cycle comprises:

exposing the metal surface to a first etch solution comprising a halogenation agent dissolved in a non-aqueous solvent to form a metal halide or oxyhalide passivation layer, which is self-limiting and insoluble in the non-aqueous solvent;

rinsing the substrate with a first purge solution to remove the first etch solution from the surface of the substrate;

exposing the metal halide or oxyhalide passivation layer to a second etch solution to selectively remove the metal halide or oxyhalide passivation layer and expose an unmodified metal surface underlying the metal halide or oxyhalide passivation layer; and rinsing the substrate with a second purge solution to remove the second etch solution from the surface of the substrate.

4. The method of claim 2, wherein the passivation layer formed on the metal surface increases the etch rate of the metal layer by: (a) reversing oxidative passivation of the metal surface, which occurred before said receiving the substrate, and/or (b) preventing oxidative passivation of the metal surface during said etching the metal layer.

5. The method of claim 1, wherein said annealing the substrate comprises exposing the substrate to a gaseous reducing agent and a temperature ranging between 100 °C. and 500 °C.

6. The method of claim 5, wherein the gaseous reducing agent comprises hydrogen ($H_2$), hydrazine ($N_2H_4$), carbon monoxide (CO), ammonia ($NH_3$), methane ($CH_4$), formic acid ($CH_2O_2$) or another volatile carboxylic acid.

7. The method of claim 5, wherein the metal layer is a ruthenium (Ru) layer having a ruthenium surface exposed on the surface of the substrate, and wherein said annealing the substrate comprises exposing the substrate to a hydrogen ($H_2$) gas and a temperature ranging between 150 °C. and 250 °C. to at least partially desorb any oxide, hydroxide or hydrate groups bound to the ruthenium surface.

8. The method of claim 1, wherein said exposing the substrate to the gas-phase L-type ligand is performed immediately after said annealing the substrate without exposing the substrate to air or other oxidizing environments.

9. The method of claim 1, wherein said exposing the substrate to the gas-phase L-type ligand comprises exposing the substrate to the gas-phase L-type ligand while the substrate is exposed to a temperature ranging between 25 °C. and 400 °C.

10. The method of claim 9, wherein the gas-phase L-type ligand is carbon monoxide (CO), cyclohexadiene ($C_6H_8$) or another alkene, ammonia ($NH_3$), an alkyl amine or a phosphine.

11. The method of claim 9, wherein the metal layer is a ruthenium (Ru) layer having a ruthenium surface exposed on the surface of the substrate, wherein said exposing the substrate to the gas-phase L-type ligand comprises exposing the substrate to carbon monoxide (CO) while the substrate is exposed to a temperature ranging from 25 °C. to less than 75 °C. to form a carbonyl passivation layer on the ruthenium surface, and wherein the carbonyl passivation layer formed on the ruthenium surface increases an etch rate of the ruthenium (Ru) layer during the wet etch process, compared to an etch rate achieved without the carbonyl passivation layer.

12. A method for conditioning a surface of a ruthenium (Ru) layer to be etched prior to etching the ruthenium layer, the method comprising:

receiving a substrate having the ruthenium layer formed thereon, wherein a ruthenium surface is exposed on a surface of the substrate;

annealing the substrate in a reducing atmosphere to at least partially reduce the ruthenium surface;

exposing the substrate to a carbon monoxide (CO) gas to form a carbonyl passivation layer on the ruthenium surface; and etching the ruthenium layer using a wet etch process, wherein the carbonyl passivation layer formed on the ruthenium surface increases an etch rate of the ruthenium layer during the wet etch process, compared to an etch rate achieved without the carbonyl passivation layer.

13. The method of claim 12, wherein said annealing the substrate comprises exposing the substrate to a hydrogen ($H_2$) gas and a temperature ranging between 150 °C. and 250 °C. to at least partially desorb any oxide, hydroxide or hydrate groups bound to the ruthenium surface.

14. The method of claim 12, wherein said exposing the substrate to the carbon monoxide (CO) gas is performed immediately after said annealing the substrate without exposing the substrate to air or other oxidizing environments.

15. The method of claim 12, wherein said exposing the substrate to the carbon monoxide (CO) gas comprises exposing the substrate to the carbon monoxide (CO) while the substrate is exposed to a temperature less than 75 °C. to form the carbonyl passivation layer on the ruthenium surface.

16. A method for conditioning a surface of a ruthenium (Ru) layer to be etched prior to etching the ruthenium layer in a wet atomic layer etching (ALE) process, the method comprising:

receiving a substrate having the ruthenium layer formed thereon, wherein a ruthenium surface is exposed on a surface of the substrate;

annealing the substrate in a reducing atmosphere to at least partially reduce the ruthenium surface;

exposing the substrate to a gas-phase L-type ligand to form a passivation layer on the ruthenium surface; and etching the ruthenium layer by performing multiple cycles of the wet ALE process, wherein each cycle comprises:

exposing the ruthenium surface to a first etch solution comprising a chlorinating agent dissolved in a non-aqueous solvent to form a ruthenium chloride or oxychloride passivation layer, which is self-limiting and insoluble in the non-aqueous solvent;

rinsing the substrate with a first purge solution to remove the first etch solution from the surface of the substrate;

exposing the ruthenium chloride or oxychloride passivation layer to a second etch solution to selectively remove the ruthenium chloride or oxychloride passivation layer and expose an unmodified ruthenium surface underlying the ruthenium chloride or oxychloride passivation layer; and rinsing the substrate with a second purge solution to remove the second etch solution from the surface of the substrate;

wherein the passivation layer formed on the ruthenium surface during said exposing the substrate to the gas-phase L-type ligand increases an etch rate of the ruthenium layer during said etching, compared to an etch rate achieved without the passivation layer.

17. The method of claim 16, wherein said annealing the substrate comprises exposing the substrate to a gaseous reducing agent and a temperature ranging between 100 °C. and 500 °C. to at least partially desorb any oxide, hydroxide or hydrate groups bound to the ruthenium surface.

18. The method of claim 17, wherein the gaseous reducing agent comprises hydrogen ($H_2$), hydrazine ($N_2H_4$), carbon monoxide (CO), ammonia ($NH_3$), methane ($CH_4$), formic acid ($CH_2O_2$) or another volatile carboxylic acid.

19. The method of claim 16, wherein said annealing the substrate comprises exposing the substrate to a hydrogen ($H_2$) gas and a temperature ranging between 150 °C. and 250 °C. to at least partially desorb any oxide, hydroxide or hydrate groups bound to the ruthenium surface.

20. The method of claim 16, wherein said exposing the substrate to the gas-phase L-type ligand is performed immediately after said annealing the substrate without exposing the substrate to air or other oxidizing environments.

21. The method of claim 16, wherein said exposing the substrate to the gas-phase L-type ligand comprises exposing the substrate to the gas-phase L-type ligand while the substrate is exposed to a temperature ranging between 25 °C. and 400 °C.

22. The method of claim 17, wherein the gas-phase L-type ligand is carbon monoxide (CO), cyclohexadiene ($C_6H_8$) or another alkene, ammonia ($NH_3$), an alkyl amine or a phosphine.

23. The method of claim 16, wherein said exposing the substrate to the gas-phase L-type ligand comprises exposing the substrate to carbon monoxide (CO) while the substrate is exposed to a temperature less than 75 °C. to form a carbonyl passivation layer on the ruthenium surface.

24. The method of claim 16, wherein said annealing the substrate comprises exposing the substrate to a carbon monoxide (CO) gas and a first temperature ranging between 150 °C. and 250 °C. to at least partially desorb any oxide, hydroxide or hydrate groups bound to the ruthenium surface, and wherein said exposing the substrate to the gas-phase L-type ligand comprises continuing to expose the substrate to the carbon monoxide (CO) gas while the substrate is exposed to a second temperature less than 75 °C. to form a carbonyl passivation layer on the ruthenium surface.

25. The method of claim 16, wherein the passivation layer formed on the ruthenium surface during said exposing the substrate to the gas-phase L-type ligand prevents formation of ruthenium dioxide ($RuO_2$) and/or other ruthenium species having oxidation states higher than 3+ on the ruthenium surface during said etching the ruthenium layer.

* * * * *